US009620552B2

United States Patent
Itonaga

(10) Patent No.: US 9,620,552 B2
(45) Date of Patent: *Apr. 11, 2017

(54) SOLID-STATE IMAGING DEVICE AND MANUFACTURING METHOD THEREOF

(71) Applicant: Sony Semiconductor Solutions Corporation, Kanagawa (JP)

(72) Inventor: Kazuichiro Itonaga, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/152,912

(22) Filed: May 12, 2016

(65) Prior Publication Data

US 2016/0260766 A1   Sep. 8, 2016

Related U.S. Application Data

(63) Continuation of application No. 13/289,086, filed on Nov. 4, 2011, now Pat. No. 9,362,321, which is a
(Continued)

(30) Foreign Application Priority Data

Jun. 4, 2007   (JP) .................................. 2007-148642

(51) Int. Cl.
*H01L 31/062*   (2012.01)
*H01L 31/113*   (2006.01)
(Continued)

(52) U.S. Cl.
CPC .... *H01L 27/14643* (2013.01); *H01L 27/1461* (2013.01); *H01L 27/1463* (2013.01);
(Continued)

(58) Field of Classification Search
USPC ........................................................ 257/270
See application file for complete search history.

(56) References Cited

U.S. PATENT DOCUMENTS 5,016,108 A * 5/1991 Akimoto ........... H01L 27/14643
257/292
5,920,092 A    7/1999 Watanabe
(Continued)

FOREIGN PATENT DOCUMENTS

JP   63-278374   11/1988
JP   02-38741    3/1990
(Continued)

OTHER PUBLICATIONS

K. Itonaga et al., "A High-Performance and Low-Noise CMOS Image Sensor with an Expanding Photodiode under the Isolation Oxide", IEDM Tech, Dig., 2005.
(Continued)

*Primary Examiner* — Dale E Page
*Assistant Examiner* — Wilner Jean Baptiste
(74) *Attorney, Agent, or Firm* — Michael Best & Friedrich LLP

(57) ABSTRACT

A solid-state imaging device includes a photoelectric conversion unit, a transistor, and an element separation region separating the photoelectric conversion unit and the transistor. The photoelectric conversion unit and the transistor constitute a pixel. The element separation region is formed of a semiconductor region of a conductivity type opposite to that of a source region and a drain region of the transistor. A part of a gate electrode of the transistor protrudes toward the element separation region side beyond an active region of the transistor. An insulating film having a thickness substantially the same as that of a gate insulating film of the gate electrode of the transistor is formed on the element separation region continuing from a part thereof under the
(Continued)

gate electrode of the transistor to a part thereof continuing from the part under the gate electrode of the transistor.

13 Claims, 26 Drawing Sheets

Related U.S. Application Data continuation of application No. 12/153,023, filed on May 13, 2008, now Pat. No. 8,072,015.

(51) Int. Cl.
    *H01L 27/146*     (2006.01)
    *H01L 31/0352*     (2006.01)

(52) U.S. Cl.
    CPC .. *H01L 27/14609* (2013.01); *H01L 27/14612* (2013.01); *H01L 27/14636* (2013.01); *H01L 27/14689* (2013.01); *H01L 27/14603* (2013.01); *H01L 31/035281* (2013.01)

(56) References Cited

U.S. PATENT DOCUMENTS

| | | | |
|---|---|---|---|
| 6,157,016 A * | 12/2000 | Clark | H01L 27/14609 250/208.1 |
| 6,221,721 B1 | 4/2001 | Takahashi | |
| 6,483,163 B2 | 11/2002 | Isogai et al. | |
| 7,348,615 B2 | 3/2008 | Koizumi | |
| 2002/0003611 A1 | 1/2002 | Ohashi | |
| 2002/0109160 A1 | 8/2002 | Mabuchi et al. | |
| 2004/0251481 A1 | 12/2004 | Rhodes | |
| 2006/0065896 A1 | 3/2006 | Abe et al. | |
| 2006/0267013 A1 | 11/2006 | Adkisson et al. | |
| 2007/0007559 A1 | 1/2007 | Lee | |
| 2008/0142856 A1 | 6/2008 | Sato et al. | |
| 2008/0266434 A1 | 10/2008 | Sugawa et al. | |
| 2009/0098679 A1 | 4/2009 | Abe et al. | |
| 2010/0237393 A1 | 9/2010 | Inoue | |

FOREIGN PATENT DOCUMENTS

| | | |
|---|---|---|
| JP | 2000-353801 A | 12/2000 |
| JP | 2001-144189 A | 5/2001 |
| JP | 2002-164528 A | 6/2002 |
| JP | 2002-270808 | 9/2002 |
| JP | 2003-258227 A | 9/2003 |
| JP | 2003-258229 A | 9/2003 |
| JP | 2005-197681 A | 7/2005 |
| JP | 2006-216616 A | 8/2006 |
| JP | 2007-158031 A | 6/2007 |
| KR | 2000-0875855 | 7/2002 |

OTHER PUBLICATIONS

Japanese Office Action issued Mar. 5, 2013 for related Japanese Application No. 2008-147443.
Korean Office Action issued Apr. 16, 2014 for corresponding Korean Application No. 10-2008-0051968.
Japanese Office Action issued Sep. 9, 2014 for corresponding Japanese Application No. 2013-245232.
Korean Office Action issued Sep. 17, 2014 for corresponding Korean Application No. 10-2014-0088407.
Japanese Office Action issued Mar. 24, 2015 for corresponding Japanese Application No. 2013-245232.

* cited by examiner

000
SOLID-STATE IMAGING DEVICE AND MANUFACTURING METHOD THEREOF

CROSS REFERENCES TO RELATED APPLICATIONS

This is a Continuation application of the U.S. patent application Ser. No. 13/289,086, filed Nov. 4, 2011, which is a Continuation application of the U.S. patent application Ser. No. 12/153,023, filed May 13, 2008, now U.S. Pat. No. 8,072,015, issued on Dec. 6, 2011, which claims priority from Japanese Patent Application JP 2007-148642 filed in the Japanese Patent Office on Jun. 4, 2007, the entire contents of which are incorporated herein by reference.

BACKGROUND OF THE INVENTION

Field of the Invention

The invention relates to a solid-state imaging device and a manufacturing method thereof, particularly to a MOS-type solid-state imaging device and a manufacturing method thereof.

Description of the Related Art

Solid-state imaging devices are broadly classified into a charge-transfer type solid-state imaging device represented by a CCD (Charge Coupled Device) image sensor, and an amplifier-type solid state imaging device represented by a MOS-type image sensor, such as a CMOS (Complementary Metal Oxide Semiconductor) image sensor, and the like. In comparing the CCD image sensor with the MOS-type image sensor, the CCD image sensor generally requires a higher drive voltage for transferring signal charges than the MOS-type image sensor does. The CCD image sensor thus has a higher power source voltage than the MOS-type image sensor.

Accordingly, the MOS-type image sensor, which is low in the power source voltage as compared with the CCD image sensor, is more advantageous than the CCD image sensor from the viewpoint of power consumption. The like is preferably used as the solid-state imaging device mounted in mobile devices, such as a portable phone with a camera, or a PDA (Personal Digital Assistant).

In the MOS-type image sensor, as a method of element separation, insulation and separation by a LOCOS (selective oxidation) element separation, an STI (Shallow Trench Isolation) separation, and the like are known (see, for example, Japanese Unexamined Patent Application Publication No. 2002-270808). Also, an EDI separation is known, in which a p-type diffusion layer is implanted into a silicon substrate, and a thick oxide film is deposited thereupon (see K. Itonaga, IEDM Tech. Dig., P33-1, 2005).

FIG. 1 illustrates a MOS-type solid-state imaging device, in particular, the principal part thereof, employing the STI separation for the element separation region. Ina solid-state imaging device 10, for example, a p-type semiconductor well region 2 is formed in an n-type silicon semiconductor substrate 1, a trench 3 is formed in the p-type semiconductor well 2, and a silicon oxide (SiO2) layer 4 is embedded in the trench 3, thereby forming a STI element separation region 5. The silicon oxide layer 4 is formed to protrude above an insulating film (for example, a silicon oxide film) 11 on the surface of the semiconductor substrate 2. An n-type source/drain region 6 of a pixel transistor (for example, an amplification transistor) is formed so as to be separated by the STI element separation region 5, and also a photodiode 7, which will be utilized as a photoelectric conversion unit, is formed. The photodiode 7 is configured as a so-called embedded-type photodiode having an n-type charge accumulation region 8 and a p-type accumulation layer 9 for suppressing dark current on the surface of the charge accumulation region 8. The p-type accumulation layer 9 is formed so as to contact the STI element separation region 5.

FIG. 2 illustrates a MOS-type solid imaging device, in particular, the principal part thereof, adopting the EDI separation for the element separation region. In a solid-state imaging device 13, for example, a p-type semiconductor well region 2 is formed in an n-type silicon semiconductor substrate 1, a p-type diffusion layer 14 is formed in the p-type semiconductor well region 2, and a silicon oxide (SiO2) layer 15, which is wider than the p-type diffusion layer 14 and thicker than an insulating film (for example, a silicon oxide film) 11 on the substrate surface, is formed on the p-type diffusion layer 14, thereby forming an EDI element separation region 16. An n-type source/drain region 6 of a pixel transistor (for example, an amplification transistor) is formed so as to be separated by the EDI element separation region 16, and also a photodiode 7, which will be utilized as a photoelectric conversion unit, is formed. The photodiode 7 is configured as a so-called embedded-type photodiode having an n-type charge accumulation region 8 and a p-type accumulation layer 9 for suppressing dark current on the surface of the charge accumulation region 8. The p-type accumulation layer 9 is formed so as to contact the p-type diffusion layer 14 of the EDI element separation region 16.

On the other hand, in the solid-state imaging device, the number of pixels increases as the resolution is increased, and as the number of pixels increases, each pixel itself is increasingly miniaturized.

SUMMARY OF THE INVENTION

However, as described above, recently in the MOS-type image sensor, if the pixel is miniaturized as the number of pixels increases, the area of a photodiode as a photoelectric conversion unit is reduced, so that the characteristics such as the saturation charge amount (so-called maximum signal charge amount handled), the sensitivity, and the like decreases. This trend is increasingly accelerated as the pixel is further miniaturized.

When the LOCOS element separation region, the STI element separation region 5, or the EDI element separation region 16 described above, is used for the element separation region, due to the effects of the thick silicon oxide film of the element separation region deposited on the semiconductor substrate, it is difficult to form the n-type charge accumulation region 8 of the photodiode 7 in a position closer to the element separation region 5 or 16 than in the present position thereof. That is, since it is difficult to reduce the distance between the n-type charge accumulation region 8 and the element separation region 5 or 16 any farther, the n-type charge accumulation region 8 may not be formed in a position closer to the element separation region 5 or 16 than in the present position.

To solve the above-described and other problems, the invention provides a solid-state imaging device and a manufacturing method thereof, in which even if the pixel is miniaturized, the area ratio of the photoelectric conversion unit per unit pixel area is increased, and thereby the characteristics such as the saturation charge amount, the sensitivity, and the like are improved.

According to an embodiment of the invention, a solid-state imaging device includes a photoelectric conversion unit, a transistor, and an element separation region separating the photoelectric conversion unit and the transistor. The photoelectric conversion unit and the transistor constitute a pixel. The element separation region is formed of a semiconductor region of a conductivity type opposite to that of a source region and a drain region of the transistor. Apart of a gate electrode of the transistor protrudes toward the element separation region side beyond an active region of the transistor. An insulating film having a thickness substantially the same as that of a gate insulating film of the gate electrode of the transistor is formed on the element separation region continuing from a part thereof under the gate electrode of the transistor to a part thereof continuing from the part under the gate electrode of the transistor.

In the solid-state imaging device according to an embodiment of the invention, because the insulating film on the element separation region continuing to the gate insulating film of the transistor has the film thickness substantially the same as that of the gate insulating film, a flat insulating film having no step or bump is formed from the channel region as an active region of the transistor to the element separation region. Thereby, the gate electrode of the transistor can be formed such that the protrusion toward the element separation region becomes short, and the photoelectric conversion unit can be formed in a region closer to the transistor by that much.

According to another embodiment of the invention, a method of manufacturing a solid-state imaging device is provided. The solid-state imaging device includes a photoelectric conversion unit and a transistor that constitute a pixel, and an element separation region formed of a semiconductor region of a conductivity type opposite to that of a source region and a drain region of the transistor. The method includes steps of forming a gate electrode of the transistor such that a part thereof protrudes outside beyond an active region of the transistor, and ion implanting impurity for forming the element separation region using the gate electrode of the transistor as a part of a mask.

In the manufacturing method of a solid-state imaging device according to an embodiment of the invention, after forming gate electrodes of the transistor, parts of which protrude beyond the active region of the transistor, impurity for forming the element separation region is ion implanted using the gate electrodes of the transistor as parts of a mask, so that the element separation region in the vicinity of the gate electrodes protruding toward the element separation region can be formed by self alignment. Accordingly, the photoelectric conversion unit can be formed closer to the transistor.

According to the solid-state imaging device and the manufacturing method thereof, according to embodiments of the invention, the photoelectric conversion unit and the transistor can be formed in regions closer to each other, so that the area ratio of the photoelectric conversion unit per unit pixel area can be increased, and the solid-state imaging device in which the characteristics such as the saturation charge amount, the sensitivity, and the like have been enhanced can be provided.

DESCRIPTION OF THE PREFERRED EMBODIMENTS

Examples of preferred embodiments of the invention will now be described with reference to drawings. The invention is not limited to the examples described below.

Figure 1:
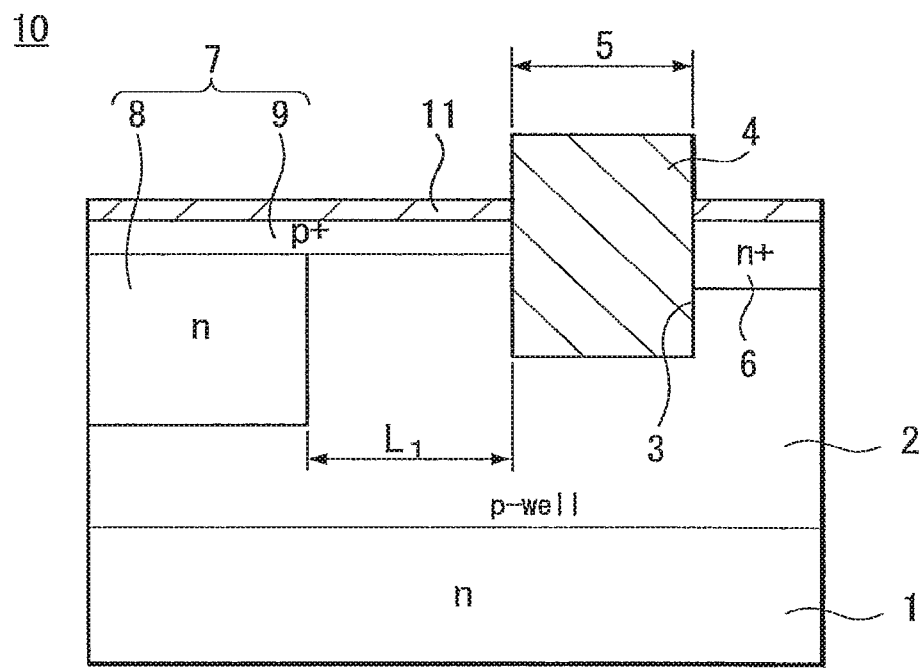
FIG. 1 is a cross section illustrating the principal part of an exemplary solid-state imaging device adopting a known STI element separation.
Figure 2:
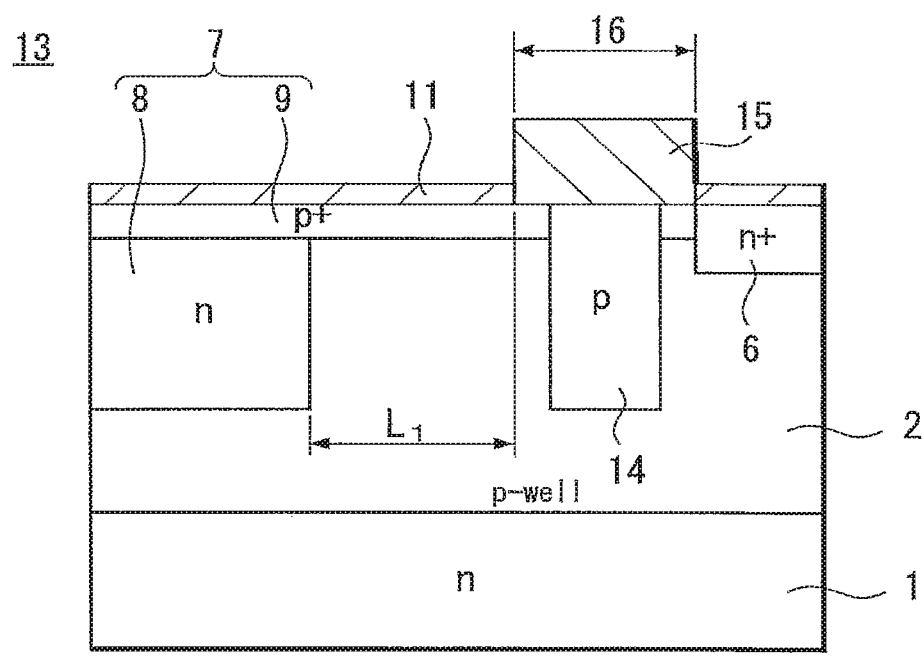
FIG. 2 is a cross section illustrating the principal part of an exemplary solid-state imaging device adopting a known EDI element separation.
Figure 3:
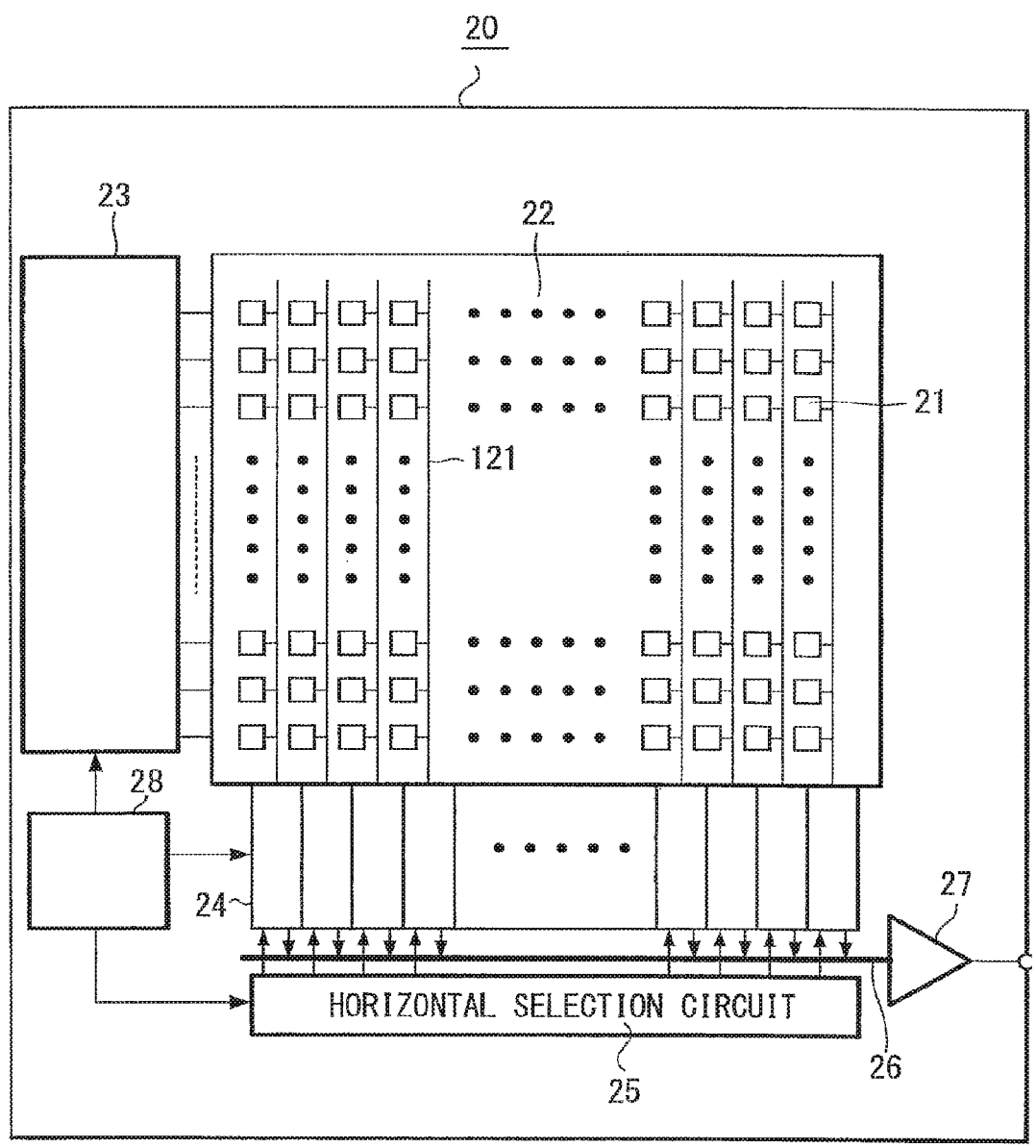
FIG. 3 is a schematic block diagram of an exemplary MOS-type image sensor, to which the invention is applied.

FIG. 3 is a schematic block diagram of an exemplary amplifier-type solid state imaging device, for example, a MOS-type image sensor, to which the invention is applied. As illustrated in FIG. 3, a MOS-type image sensor 20 according to this example includes a unit pixel 21 including a photodiode as a photoelectric conversion unit, a pixel array unit 22 in which the pixels 21 are arranged two-dimensionally in a regular manner, a vertical selection circuit 23, a column circuit 24 as a signal processing circuit, a horizontal selection circuit 25, a horizontal signal line 26, an output circuit 27, a timing generator 28, and the like and is configured as an area sensor.

In the pixel array unit 22, for example, a vertical signal line 121 is arranged for each column of pixel arrangement in a matrix state. The specific configuration of the unit pixel 21 will be described later. The vertical selection circuit 23 includes a shift resistor, and the like. The vertical selection circuit 23 sequentially outputs control signals, such as transfer signals driving a readout transistor 112 of the pixel 21 (hereinafter, called a transfer transistor, and a readout gate electrode is called a transfer gate electrode) (see FIG. 4 and FIG. 5) and reset signals driving a reset transistor 113 (see FIG. 4 and FIG. 5), in units of lines, to selectively drive the pixels 21 of the pixel array unit 22 in units of lines.

The column circuit 24 is a signal processing circuit arranged for pixels in the vertical direction, i.e., for each vertical signal line 121, and includes an S/H (sample and hold) circuit, a CDS (Correlated Double Sampling) circuit, and the like. The horizontal selection circuit 25 includes a shift register, and the like and sequentially selects signals of respective pixels 21 outputted through the column circuit 24 and outputs the signals to the horizontal signal line 26. Note that in FIG. 3, for the simplicity of figure, illustration of horizontal selection switches is omitted. The horizontal selection switches are sequentially turned on and off in units of columns by the horizontal selection circuit 25.

Signals of unit pixels 21 sequentially outputted from the column circuit 24 in units of columns, based on selection driving by the horizontal selection circuit 25, are supplied to the output circuit 27 through the horizontal signal line 26. After having been applied with signal processing, such as amplification, and the like in the output circuit 27, the signals are outputted to the outside of the device. The timing generator 28 generates various timing signals to drive and control the vertical selection circuit 23, the column circuit 24, and the horizontal selection circuit 25, based on these timing signals.

Figure 4:
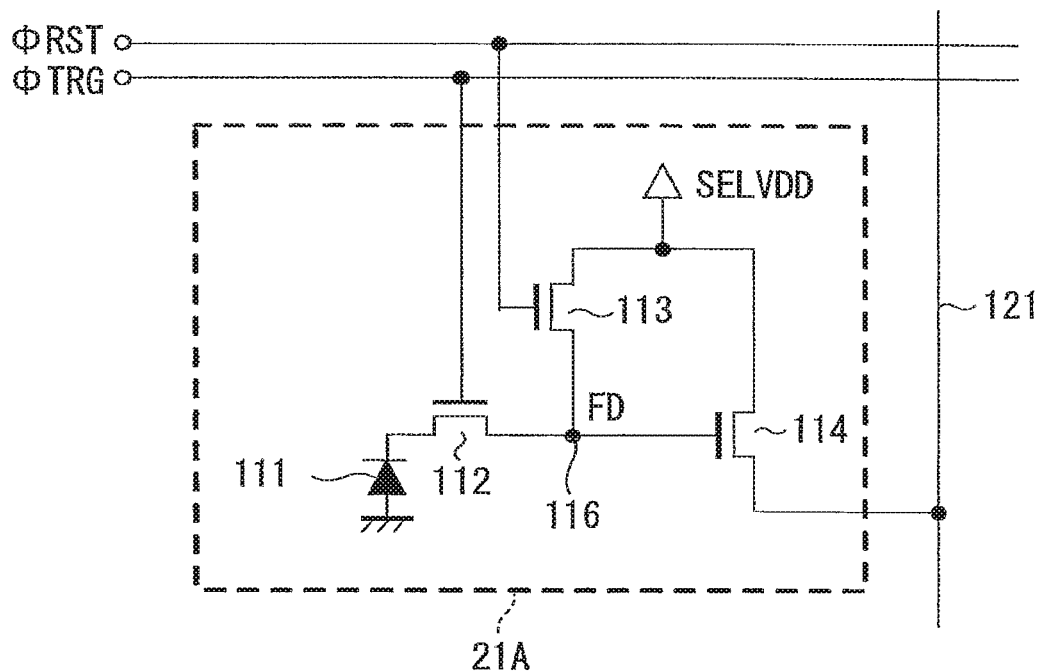
FIG. 4 is a circuit diagram illustrating an example of a circuit configuration of a unit pixel.

FIG. 4 is a circuit diagram illustrating an example of a circuit configuration of the unit pixel 21. As illustrated in FIG. 4, a unit pixel 21A according to this example is configured as a pixel circuit including, in addition to a photoelectric conversion unit, for example, a photodiode 111, three pixel transistors, which are transfer transistor 112, reset transistor 113, and an amplification transistor 114. In this example, n-channel MOS transistors are used for the pixel transistors 112, 113, 114.

The transfer transistor 112 is connected between a cathode of the photodiode 111 and an FD (floating diffusion) unit 116, and transfers signal charges (in this example, electrons) photo-electrically converted by the photodiode 111 and accumulated therein, to be transferred to the FD unit 116 based upon a transfer pulse φTRG given to the gate.

The reset transistor 113, the drain thereof is connected to a selective power source SELVDD and the source thereof is connected to the FD unit 116, respectively, resetting the potential of the FD unit 116 based on a reset pulse φRST given to the gate prior to transferring a signal charge from the photodiode 111 to the FD unit 116. The selective power source SELVDD selects a VDD level and a GND level for the power source voltage.

The amplification transistor 114 has a source follower configuration in which the gate is connected to the FD unit 116, the drain connected to the selective power source SELVDD, and the source connected to the vertical signal line 121, respectively. The amplification transistor 114 starts to operate when the selective power source SELVDD selects the VDD level, thereby selecting the pixel 21A, and outputs the potential of the FD unit 116 obtained after being reset by the reset transistor 113 to the vertical signal line 121 as a reset level. Further, the amplification transistor 114 outputs the potential of the FD unit 116 after having transferred a signal charge with the transfer transistor 112, to the vertical signal line 121 as a signal level.

Figure 5:
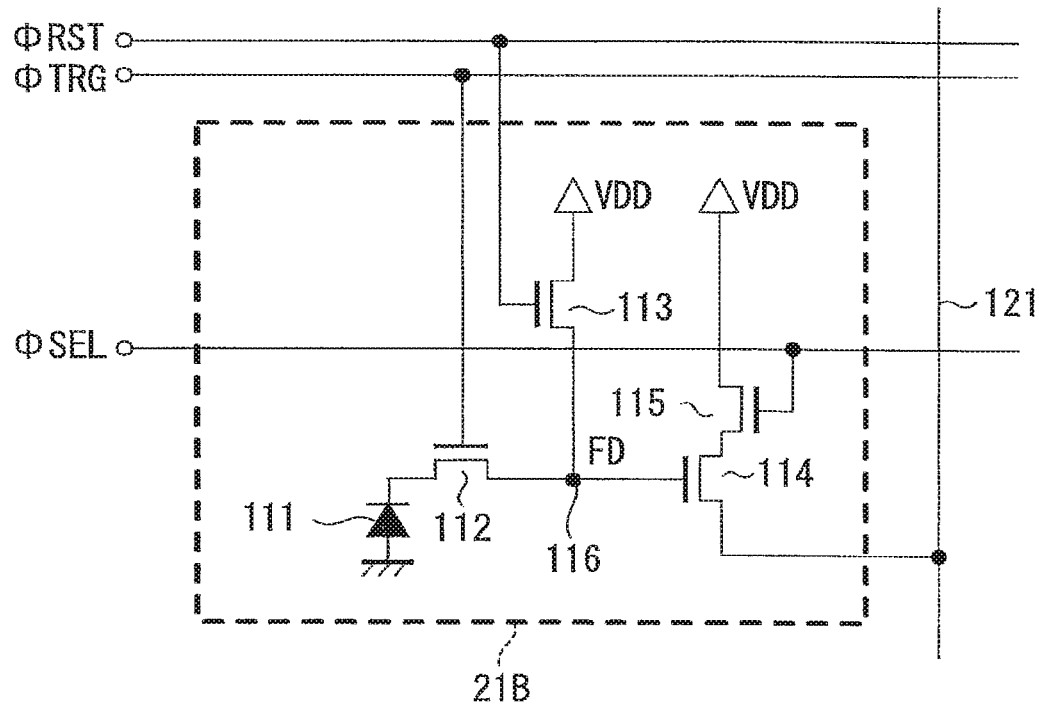
FIG. 5 is a circuit diagram illustrating another example of the circuit configuration of the unit pixel.

FIG. 5 is a circuit diagram illustrating another example of the circuit configuration of the unit pixel 21. As illustrated in FIG. 5, a unit pixel 21B according to this example is configured as a pixel circuit including, in addition to a photoelectric conversion unit, a photodiode 111, four pixel transistors, examples of which include a transfer transistor 112, a reset transistor 113, an amplification transistor 114, and a selection transistor 115. In this example, n-channel MOS transistors can be employed as for the pixel transistors 112, 113, 114, and 115.

The transfer transistor 112 is connected between a cathode of the photodiode 111 and an FD unit 116, and transfers signal charges (in this example, electrons), photo-electrically converted by the photodiode 111 and accumulated therein, to be transferred to the FD unit 116 based upon a transfer pulse φTRG given to the gate.

The reset transistor 113, the drain thereof connected to a power source VDD, and the drain thereof connected the FD unit 116, respectively, resets the potential of the FD unit 116, prior to transferring a signal charge from the photodiode 111 to the FD unit 116, based on a reset pulse φRST given to the gate.

The selection transistor 115, the drain connected to the power source VDD, and the source connected to the drain of the amplification transistor 114, respectively, turn ON when a selection pulse φSEL is supplied to the gate, and supplies power source voltage to the amplification transistor 114 to select the pixel 21B. Note that the selection transistor 115 may be connected between the source of the amplification transistor 114 and the vertical signal line 121.

The amplification transistor 114 has the source follower configuration in which the gate is connected to the FD unit 116, the drain is connected to the source of the selection circuit 115, and the source is connected to the vertical signal line 121, respectively. The amplification transistor 114 outputs the potential of the FD unit 116 after being reset by the reset transistor 113 to the vertical signal line 121 as a reset level. Further, the amplification transistor 114 outputs the potential of the FD unit 116 after having transferred a signal charge with the transfer transistor 112, to the vertical signal line 121 as a signal level.

For the pixel array unit 22, various layouts may be applied, such as a layout in which unit pixels are arranged as described above, a layout in which pixel transistors other than the transfer transistor are shared by a plurality of pixels (for example, two pixels, four pixels) (hereinafter called pixel sharing), and the like.

Next, an example of the pixel array unit according to an embodiment of the invention that will be applied to the above-described pixel array unit 22 is described.

FIGS. 6 to 10 each illustrate an example of a solid-state imaging device, a MOS-type image sensor in this example, according to a first embodiment of the invention. The MOS-type image sensor in this embodiment includes the pixel array unit 22 in which pixel transistors are shared by two pixels.

Figure 6:
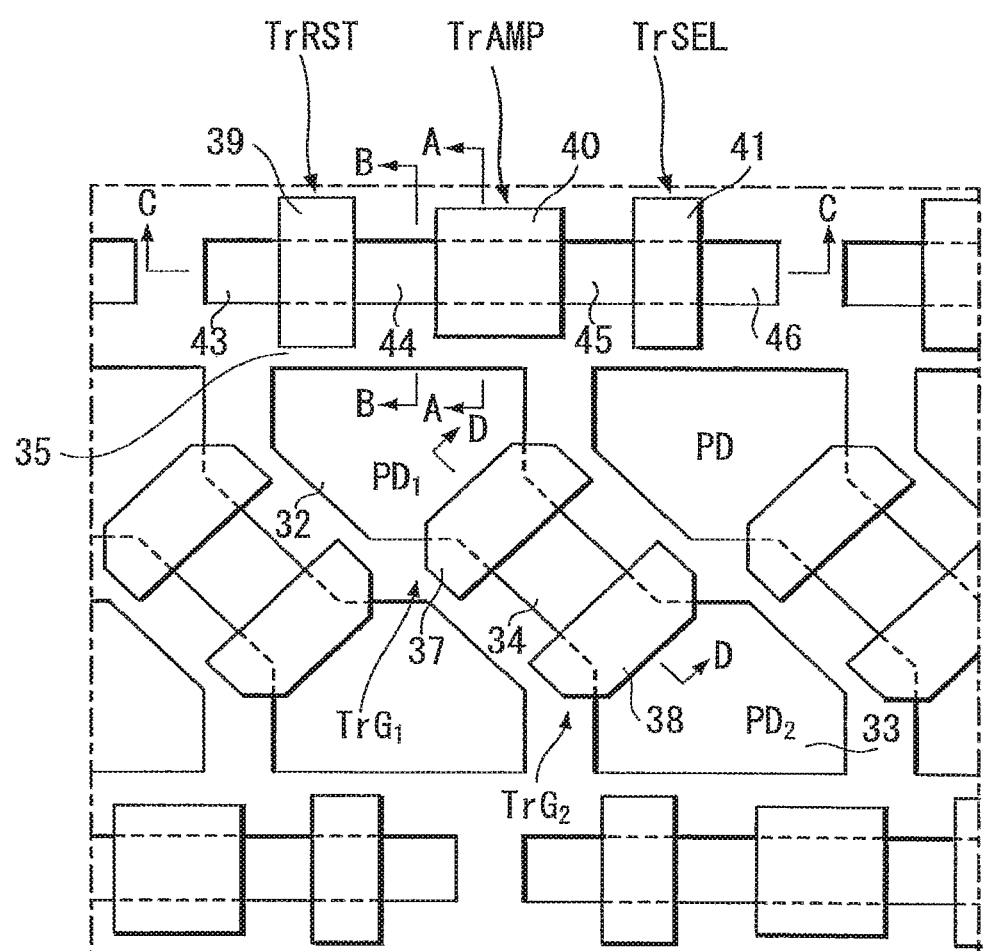
FIG. 6 is a configuration diagram of a pixel array of a solid-state imaging device according to the first embodiment of the invention.

FIG. 6 illustrates an exemplary layout of a pixel array in which pixel transistors are shared by two pixels. In this example, as illustrated in FIG. 6, a first photodiode (PD1) 32 and a second photodiode (PD2) 33 as photoelectric conversion units are connected with a common FD unit 34, which is formed by a first conductivity-type, an n-type in this example, semiconductor region (diffusion layer), through respective gate units including gate insulating films of transfer transistors TrG1 and TrG2 as well as transfer gate electrodes 37, 38. In addition, a reset transistor TrRST, an amplification transistor TrAMP, and a selection transistor TrSEL, which are mutually connected, are formed to sandwich an element separation region 35 with a region where the first and second photodiodes 32, 33 and the transfer transistors TrG1, TrG2 have been formed. These two-pixel sharing configurations are arranged two-dimensionally in a regular manner.

The reset transistor TrRST is formed by n-type semiconductor regions (diffusion layers) 43, 44, which will be utilized as source and drain regions, and a reset gate electrode 39 formed through a gate insulating film. The amplification transistor TrAMP is formed of n-type semiconductor regions (diffusion layers) 44, 45, which will be utilized as source and drain regions, and an amplification gate electrode 40 formed through a gate insulating film. The selection transistor TrSEL is formed by n-type semiconductor regions (diffusion layers) 45, 46, which will be utilized as source and drain regions, and a selection gate electrode 41 formed through a gate insulating film.

Figure 11:
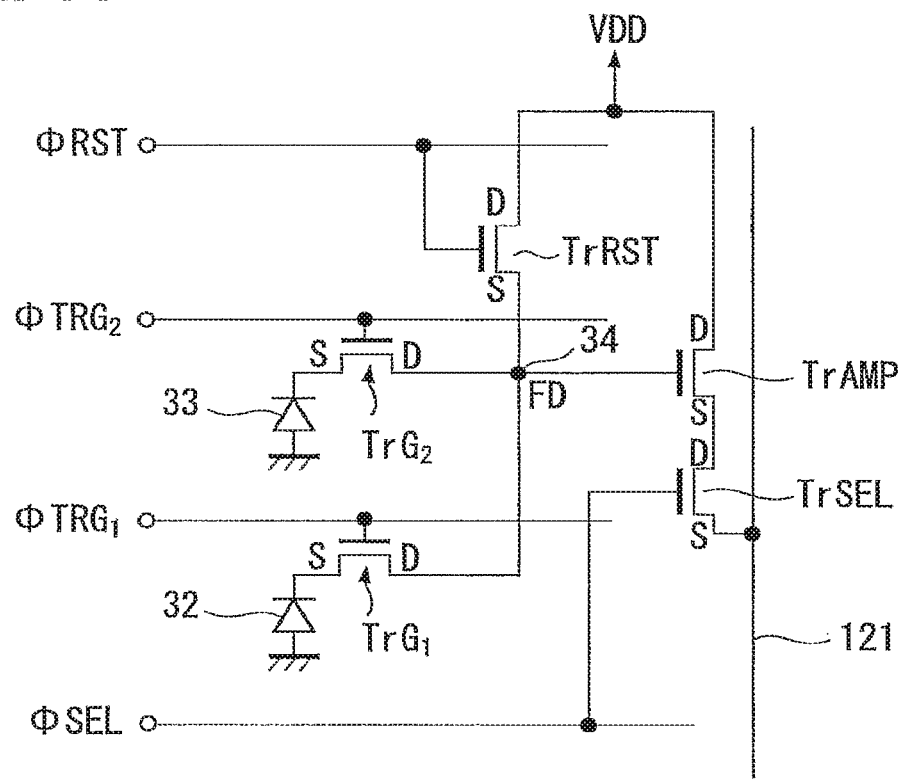
FIG. 11 is a circuit diagram of an example of an equivalent circuit for two-pixel sharing.

FIG. 11 illustrates an example of an equivalent circuit for two-pixel sharing. In this embodiment, the circuit includes two photodiodes 32, 33, two transfer transistors TrG1, TrG2, one FD unit 34, a shared reset transistor TrRST, amplification transistor TrAMP, and a selection transistor TrSEL.

The first and second photodiode 32, 33 are connected to the common FD unit 34 through the transfer transistors TrG1, TrG2. Transfer pulses φTRG1, φTRG2 are supplied to the gates of the first and second transfer transistor TrG1, TrG2.

The FD unit 34 is connected to the gate of the amplification transistor TrAMP and also to the source of the reset transistor TrRST. The drain of the reset transistor TrRST is connected to a power source VDD. A reset pulse φRST is supplied to the gate of the reset transistor TrRST.

The drain of the amplification transistor TrAMP is connected with the power source VDD, and the source of the amplification transistor TrAMP is connected to the drain of the selection transistor TrSEL. The source of the selection transistor TrSEL is connected to the vertical signal line 121, and a selection pulse φSEL is supplied to the gate of the selection transistor TrSEL.

The operation of one pixel in this circuit configuration is basically substantially the same as described with reference to FIG. 5. In this circuit configuration, charges photo-electrically converted by the photodiodes 32, 33 are sequentially read out to the FD unit 34 at certain time intervals, converted to pixel signals in the amplification transistor TrAMP, and read out to the vertical signal line 121 through the selection transistor TrSEL. After having been converted to pixel signals, the charges read out to the FD unit 34 are reset through the reset transistor TrRST.

Figure 10:
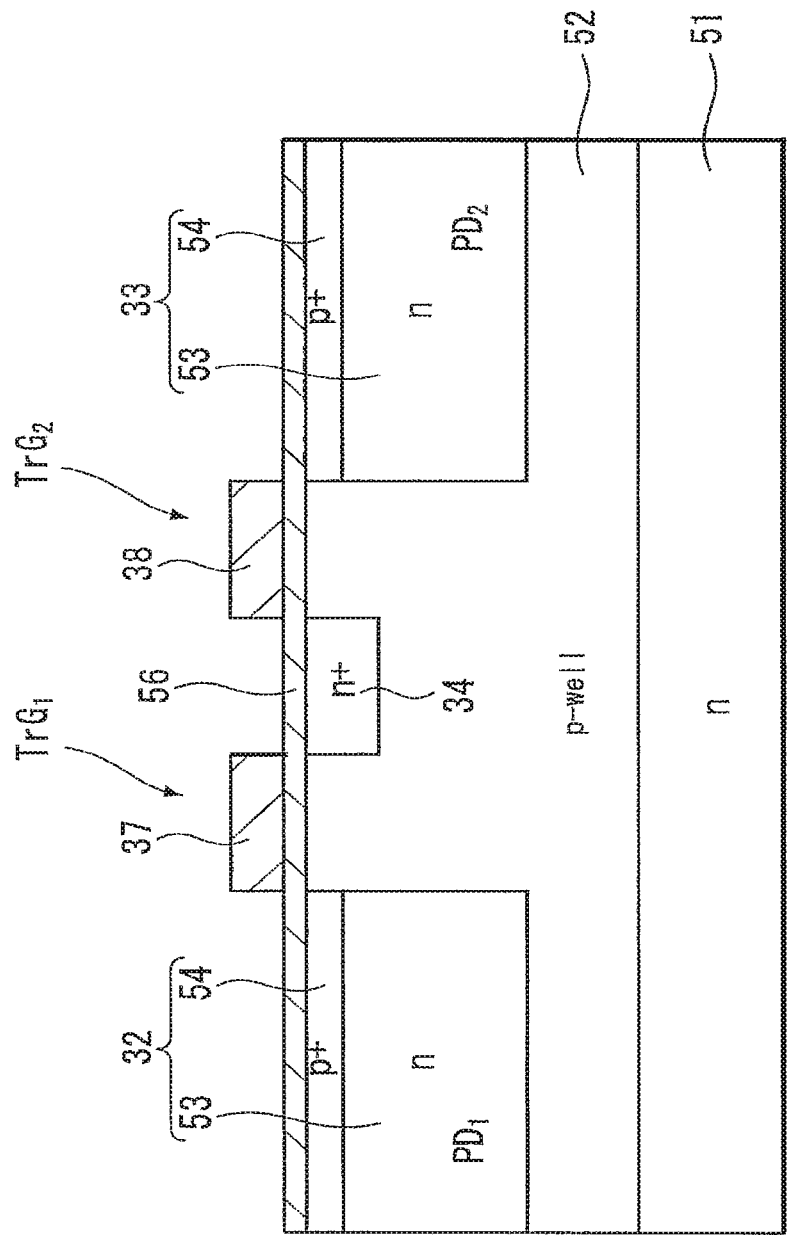
FIG. 10 is a cross section on a D-D line of FIG. 6.

In this embodiment, the first and second photodiodes 32, 33 sharing pixel transistors are configured as illustrated in FIG. 6 and FIG. 10 (cross section on a D-D line of FIG. 6) by forming a second conductivity-type, for example a p-type, semiconductor well region 52 in a first conductivity-type semiconductor substrate 51, in this example, an n-type silicon substrate, and by also forming, in this p-type semi-conductor well region 52, an n-type semiconductor region (diffusion layer) which will be utilized as a charge accumulation region 53. A p-type accumulation layer 54 is also formed for suppressing dark current on the charge accumulation region 53. The photodiodes 32, 33 are symmetrically formed to sandwich the common FD unit 34 including a common n-type semiconductor region (diffusion layer) formed in the p-type semiconductor well region 52.

The first transfer transistor TrG1 includes the transfer gate electrode 37 formed on a gate insulating film 56, with the first photodiode 32 utilized as the source and the common FD unit 34 including the n-type semiconductor region utilized as the drain. The second transfer transistor TrG2 includes the transfer gate electrode 38 formed on the gate insulating film 56, with the second photodiode 33 utilized as the source and the common FD unit 34 utilized as the drain.

Figure 9:
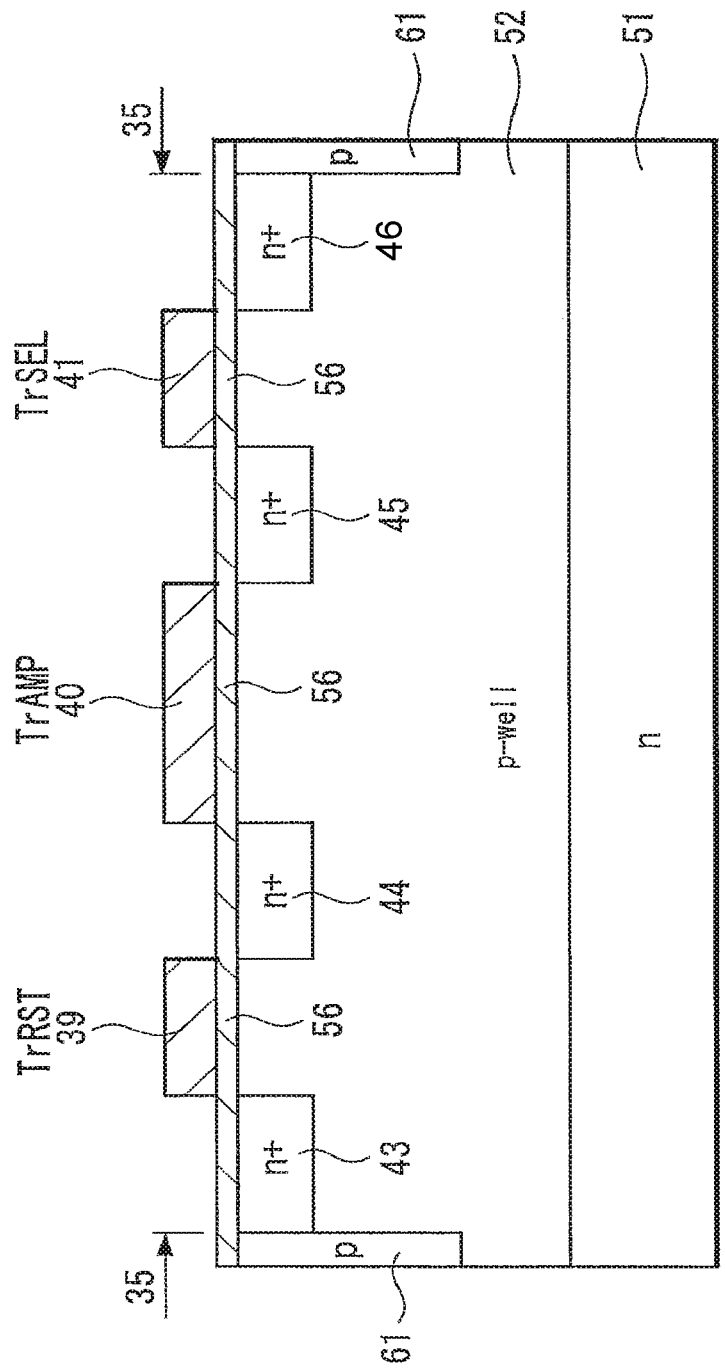
FIG. 9 is a cross section on a C-C line of FIG. 6.

The reset transistor TrRST, the amplification transistor TrAMP, and the selection transistor TrSEL are configured as illustrated in FIG. 6 and FIG. 9 (cross section on a C-C line of FIG. 6). That is, the reset transistor TrRST includes the first and second n-type source and drain regions 43, 44 formed in the p-type semiconductor well region 52 and the reset gate electrode 39 formed through the gate insulating film 56. The amplification transistor TrAMP includes the second and third n-type source and drain regions 44, 45 formed in the p-type semiconductor well region 52 and the amplification gate electrode 40 formed through the gate insulating film 56. The selection TrSEP includes the third and fourth n-type source and drain regions 45, 46 formed in the p-type semiconductor well region 52 and the selection gate electrode 41 formed through the gate insulating film 56.

The pixel array in this example is laid out such that as illustrated in FIG. 6, regions including two photodiodes 32, 33 and two transfer transistors TrG1, TrG2 are arranged two-dimensionally in horizontal and vertical directions, and between rows of these regions including two photodiodes 32, 33 and two transfer transistors TrG1, TrG2 (between adjacent rows in the vertical direction), a region including the reset transistor TrRST, the amplification transistor TrAMP, and the selection transistor TrSEL is arranged.

Then, the element separation region 35 is formed between the region including the photodiodes 32, 33 and the transfer transistors TrG1, TrG2, between the region including the reset transistor TrRST, the amplification transistor TrAMP, and the selection transistor TrSEL, and also between adjacent pixels (see FIG. 6).

The gate insulating film 56 of respective pixel transistors (the transfer transistors TrG1, TrG2, the reset transistor TrRST, the amplification transistor TrAMP, and the selection transistor TrSEL) may be formed of a silicon oxide (SiO2) film by heat oxidation. The gate electrodes 37, 38, 39, 40, and 41 of the pixel transistors TrG1, TrG2, TrRST, TrAMP, TrSEL may be formed of a polysilicon film, for example. The gate electrodes 37 to 41 of the pixel transistors TrG1, TrG2, TrRST, TrAMP, TrSEL are formed to cover channel regions 50 of the pixel transistors TrG1, TrG2, TrRST, TrAMP, TrSEL, with parts thereof protruded over the element separation region 35 beyond a width W1 in the channel width direction (i.e., the direction perpendicular to the channel length) of source regions S and drain regions D (34, 43 to 46). A protrusion length d1 of a protrusion 62 extending over the element separation region 35 of each of the gate electrodes 37 to 41 is formed as short as possible as described later.

Figure 7:
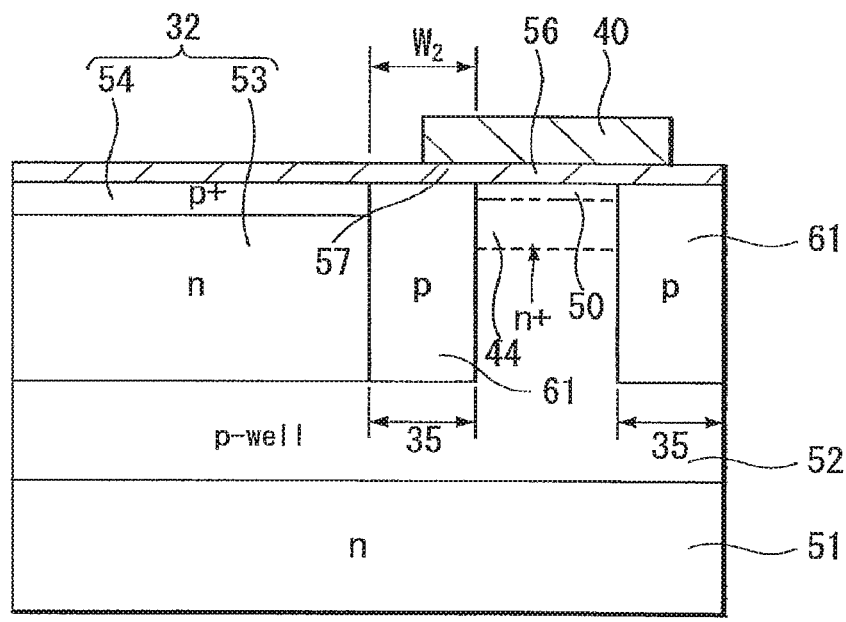
FIG. 7 is a cross section on an A-A line of FIG. 6.
Figure 8:
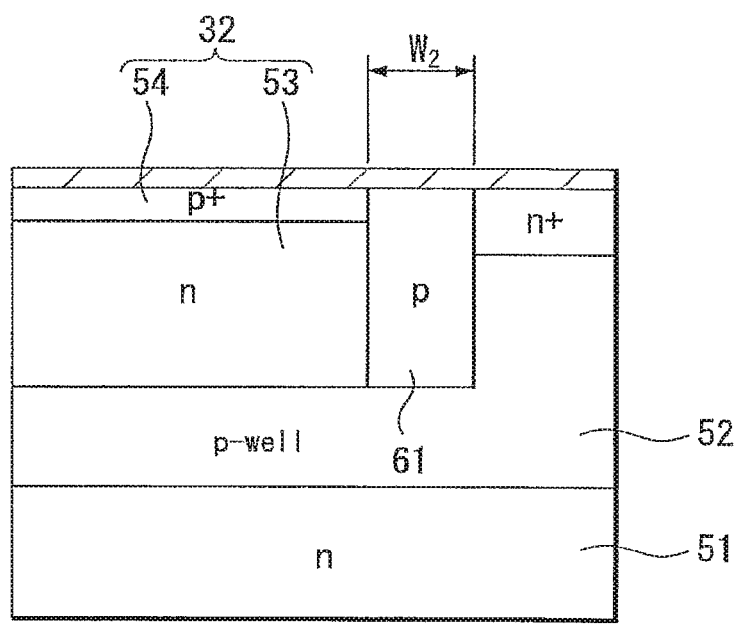
FIG. 8 is a cross section on a B-B line of FIG. 6.
Figure 12:
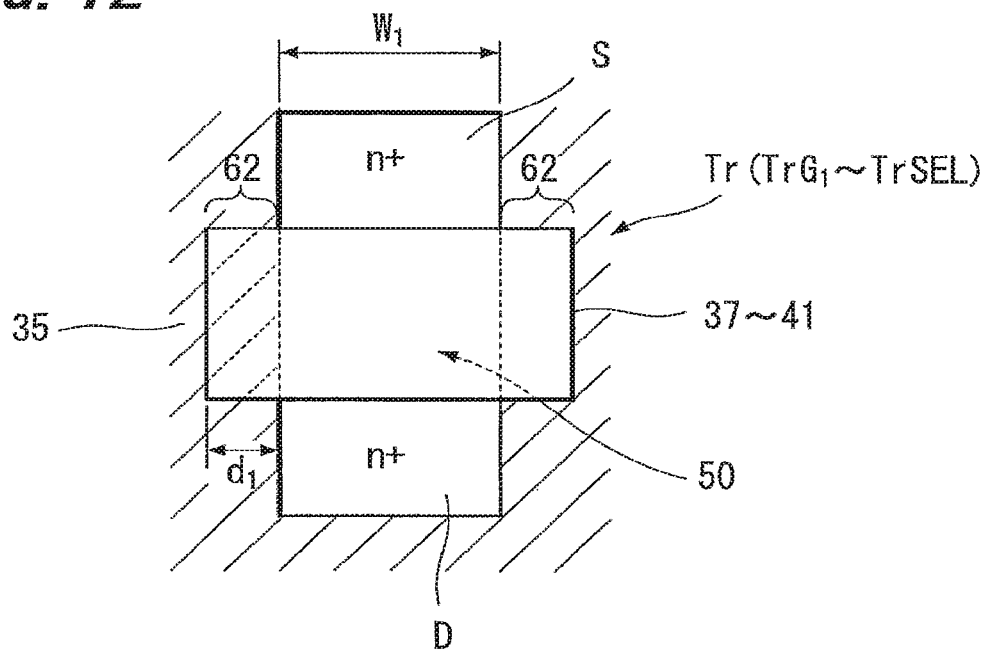
FIG. 12 is a plane view of a pixel transistor part and an element separation region part of the pixel array for explaining the invention.

Further, in this embodiment, as illustrated in FIG. 7 (cross section on an A-A line of FIG. 6) and FIG. 8 (cross section on a B-B line of FIG. 6), the element separation region 35 is formed by a semiconductor region 61 of a counter-conductive type to the source regions and the drain regions of the pixel transistors. That is, in this example, the element separation region 35 is formed with the p-type semiconductor region 61. Further, parts of the gate electrodes 37 to 41 of the pixel transistors protrude toward the element separation region 35 side beyond the channel regions that become active regions of the pixel transistors. On the element separation region 35 continuing from parts thereof under protrusions (extended parts) 62 of the gate electrodes 37 to 41 extending over the element separation region 35 (see FIG. 12), an insulating film 57 having the thickness substantially the same as that of the gate insulating film 56 is formed. That is, as an insulating film extending from the channel regions 50 of the pixel transistors (in FIG. 7, the amplification transistor TrAMP) to the element separation region 35 is actually formed by the gate insulating film 56 and is eventually formed in a flat state having no step or bump.

In other words, in the region from the channel regions 50 to the element separation region 50, an insulating film thicker than the gate insulating film 56 will not be formed.

The gate electrodes 37 to 41 are formed on the flat insulating films 56, 57 (so-called gate insulating films) extending from the channel regions 50 to the element separation region 35. Even if the pixel is miniaturized and the channel region width of each transistor is miniaturized, because the gate insulating film 56 and the insulating film 57 on the element separation region 35 are formed in the same thickness, the gate electrodes 37 to 41 are formed as electrodes of high reliability and high quality, without producing an air hole in the electrode film constituting the gate electrodes 37 to 41.

The photodiodes 32, 33 are formed to locate them as closely as possible to the regions of the pixel transistors so as to enlarge respective areas. Therefore, the p-type semiconductor region 61 of the element separation region 35 is formed in a relatively narrow width W2, and the photodiodes 32, 33 are formed so as to contact the element separation region 35. In this case, the gate electrodes 37 to 41 are formed such that the protrusion length d1 of the protrusions 62 extending over the element separation region 35 is formed as short as possible (see FIG. 7) so as not to reach the photodiodes 32, 33.

The reason for this is as follows. Because the insulating film 57 on the element separation region 35 is formed in the thickness comparable to that of the gate insulating film 56, if the protrusions 62 over the element separation region 35 of the gate electrode 37 to 41 are formed to reach the photodiodes 32, 33, a parasitic transistor is generated between the photodiodes 32, 33 and the channel regions 50 of the pixel transistors. If such a parasitic transistor is generated, charges of the photodiodes 32, 33 are drawn toward the pixel transistors when the pixel transistors are turned on. To prevent this, the protrusions 62 extending over the element separation region 35 are formed short so as not to reach the photodiodes 32, 33.

On the other hand, the p-type semiconductor region 61, which will be utilized as the element separation region 35, is formed by ion implanting p-type impurity after forming the gate electrodes 37 to 41, using the gate electrodes 37 to 41 as parts of a mask for ion implantation. In the element separation region 35 in the vicinity of the gate electrodes, the p-type semiconductor region 61 is formed by self-alignment. Thereby, the protrusion length d1 of the gate electrodes 37 to 41, that is, the protrusion amount, is made short, and the element separation region 35 in the predetermined width W2 is formed between the gate electrodes 37 to 41 and the photodiodes 32, 33 (see FIG. 7).

Figure 13:
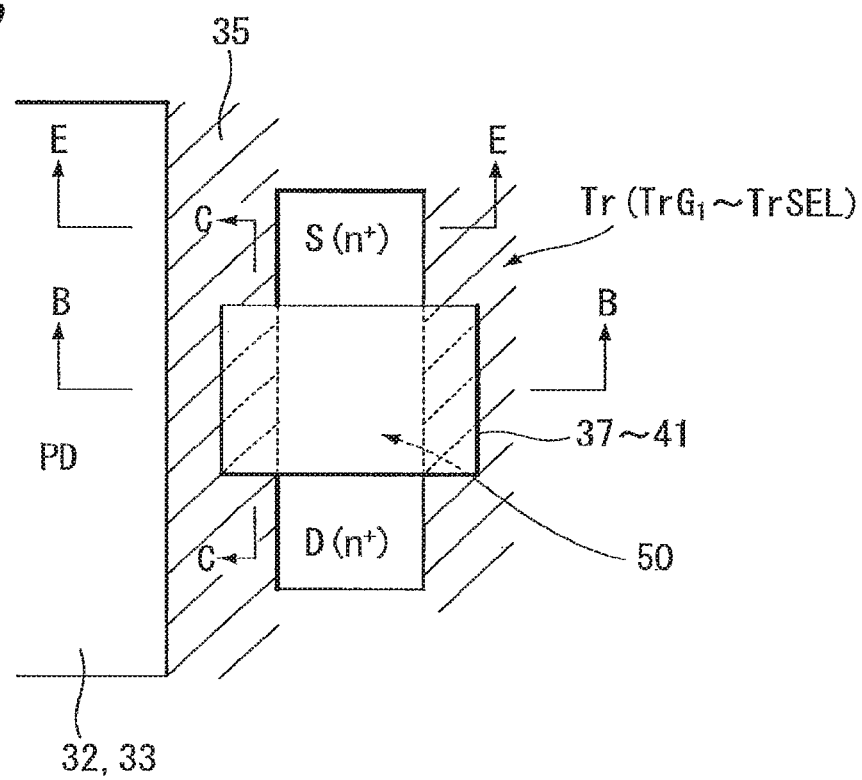
FIG. 13 is a plane view of an element separation region according to the first embodiment of the invention.
Figure 14:
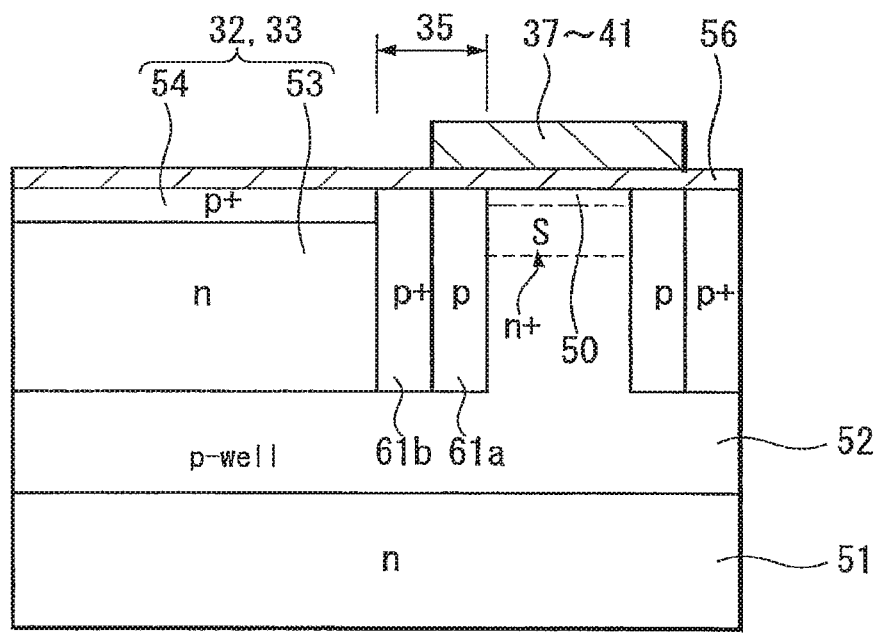
FIG. 14 is a cross section on a B-B line of FIG. 13.

The formation process of the element separation region 35 will be described later, however, in the example illustrated in FIG. 6 through FIG. 10, as illustrated in FIG. 13 and FIG. 14 (cross section on a B-B line of FIG. 13), the first ion implantation of p-type impurity is carried out before formation of the gate electrodes 37 to 41, and after forming the gate electrodes 37 to 41, the second ion implantation of p-type impurity is carried out, and thereby the element separation region 35 is formed. The impurity density naturally becomes higher in the region in which ion implantation has been carried out twice.

As described later (see FIG. 15), it is preferable to determine the ion implantation conditions, in particular, the dose amount for the element separation region 35 so as not to cause to produce current paths of leak currents i1, i2 from each of the pixel transistors. The impurity density of the element separation region 35 is set equal to or below $1 \times 10^{14}$ cm$^{-2}$ in the dose amount. If the impurity density exceeds $1 \times 10^{14}$ cm$^{-2}$, the electric field is relatively high and dark current increases. Here, it is preferable to set the impurity density of the element separation region 35 equal to or greater than $1 \times 10^{13}$ cm$^{-2}$ in the dose amount. If the impurity density is equal to or greater than $1 \times 10^{13}$ cm$^{-2}$, leak current is prevented from being generated and element separation can be stably performed. When forming the element separation region 35 by implementing ion implantation twice as described above, for example, the impurity density for the first ion implantation may be set on the order of $10^{12}$ cm$^{-2}$ and for the second ion implantation, it may be set on the order of $1 \times 10^{13}$ cm$^{-2}$. As a specific example, by determining the impurity density for the first ion implantation at $1 \times 10^{12}$ cm$^{-2}$ and for the second ion implantation at $1 \times 10^{13}$ cm$^{-2}$, sufficient element separation can be achieved. A p-type semiconductor region 61a of relatively low density is formed by the first ion implantation and a p-type semiconductor region 61b of relatively high density is formed by the second ion implantation (see FIG. 14). By ion implanting p-type impurity for example of $1 \times 10^{12}$ cm$^{-2}$ in the dose amount under the protrusions 62 of the gate electrodes, generation of dark current and white spots under the protrusions 62 is prevented.

To the channel regions 50 of the pixel transistors, ion implantation of impurity for adjusting a threshold voltage Vt is carried out. This ion implantation for adjusting the threshold voltage Vt is carried out to regions of the same width as that in the channel width direction of the source regions and the drain regions, or to regions inside of such regions. Preferably, as illustrated in FIG. 17, ion implantation for adjusting the threshold voltage Vt is carried out to the inside of the above-described width W1 of the source regions S and the drain regions D to form the effective channel regions 50 with a width W3 inside of the above-described width W1 of the source regions S and the drain regions D. By making the width W3 of the effective channel regions 50 narrower than the width W1 of the source regions S and the drain regions D, when the pixel transistors are turned on, currents flow through the channel regions 50, and the leak currents i1 turning around under the protrusions 62 of the gate electrodes 37 to 41 can be more effectively prevented. Further, the leak currents i2 from the pixel transistors TrG1, TrG2, TrRST, TrAMP, TrSEL to the adjacent photodiodes 32, 33 can be also more effectively prevented.

The impurity density of the source regions S and the drain regions D of the pixel transistors TrG1, TrG2, TrRST, TrAMP, TrSEL is preferably set in the range from $1 \times 10^{14}$ cm$^{-2}$ to $1 \times 10^{15}$ cm$^{-2}$ in the dose amount. To form ohmic electrodes in the source regions S and the drain regions D, the impurity density equal to $1 \times 10^{14}$ cm$^{-2}$ or greater may be required. On the other hand, if the electric field intensity of the source regions S and the drain regions D becomes stronger, electrons generated due to the strong electric field are flown into the photodiodes 32, 33. To prevent this phenomenon, the impurity density is preferably $1 \times 10^{15}$ cm$^{-2}$ or below.

In each of the gate electrodes 37 to 41 of the pixel transistors TrG1, TrG2, TrRST, TrAMP, TrSEL, a first portion 63 corresponding to the channel region 50 and a second portion (protrusion) 62 extending from the channel region 50 toward the element separation region 35 may be formed of the same or different materials. The gate electrodes 37 to 41 may be formed of, for example, polysilicon, amorphous silicon, or the like, (formed of polysilicon in this example) and impurities may be introduced to the first portions 63 and the second portions 62 in the same or different fashion. FIG. 16 to FIG. 21 each illustrate examples thereof. Note that S denotes a source region, D denotes a drain region, and numeral 35 denotes an element separation region.

Figure 16A:
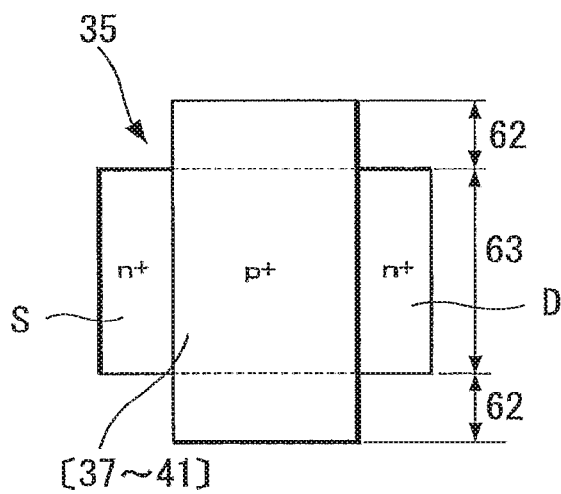
FIG. 16A and FIG. 16B area plane view and a cross section illustrating an example of a gate electrode of a pixel transistor.
Figure 16B:
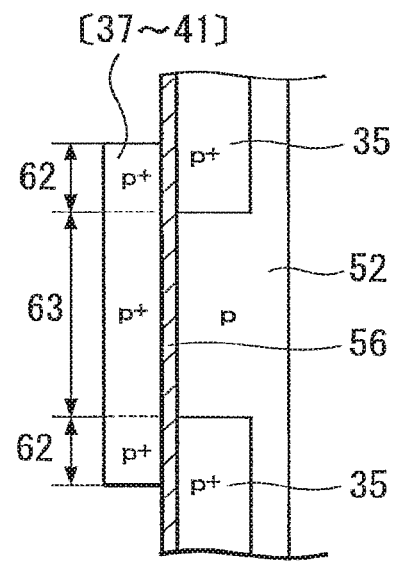

In the example illustrated in FIG. 16A and FIG. 16B, the first portions 63 and the second portions 62 of the gates electrodes 37 to 41 are formed by an p$^+$ polysilicon into which an p-type impurity has been introduced.

Figure 17A:
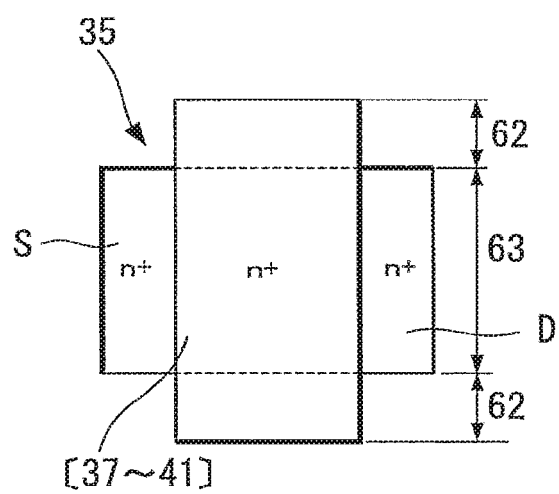
FIG. 17A and FIG. 17B area plane view and a cross section illustrating another example of a gate electrode of a pixel transistor.
Figure 17B:
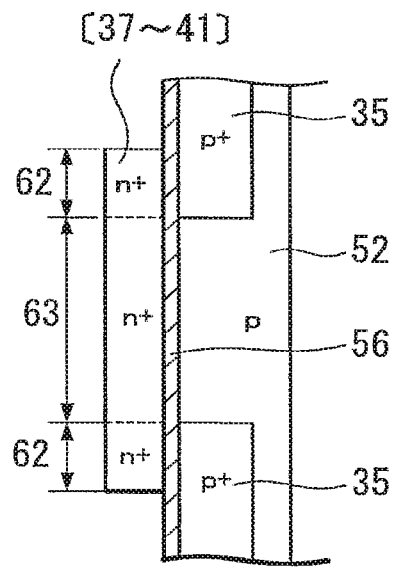

In the example illustrated in FIG. 17A and FIG. 17B, the first portions 63 and the second portions 62 of the gates electrodes 37 to 41 are formed of an n$^+$ polysilicon into which an n-type impurity has been introduced.

Figure 18A:
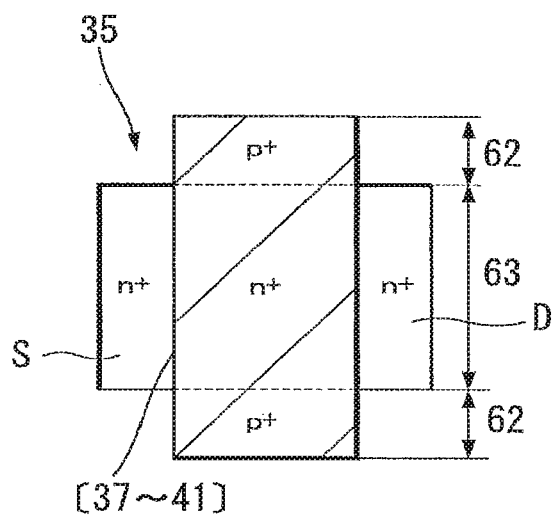
FIG. 18A and FIG. 18B area plane view and a cross section illustrating another example of a gate electrode of a pixel transistor.
Figure 18B:
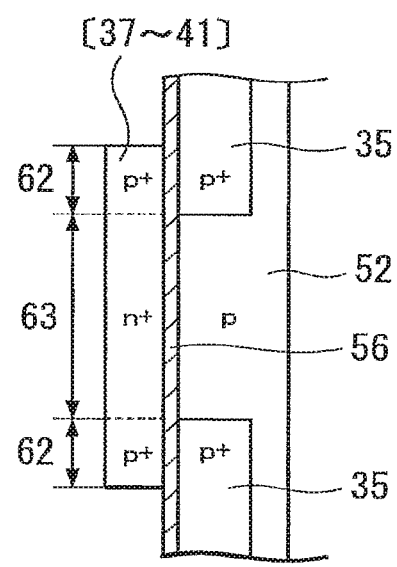

In the examples illustrated in FIG. 18A and FIG. 18B, the first portions 63 of the gates electrodes 37 to 41 are formed of an n$^+$ polysilicon into which an n-type impurity has been introduced The second portions 62 are formed of an p$^+$ polysilicon into which an p-type impurity has been introduced (the first portion 63 and the second portion 62 are formed of the n-type polysilicon and the p-type polysilicon, respectively).

Figure 19A:
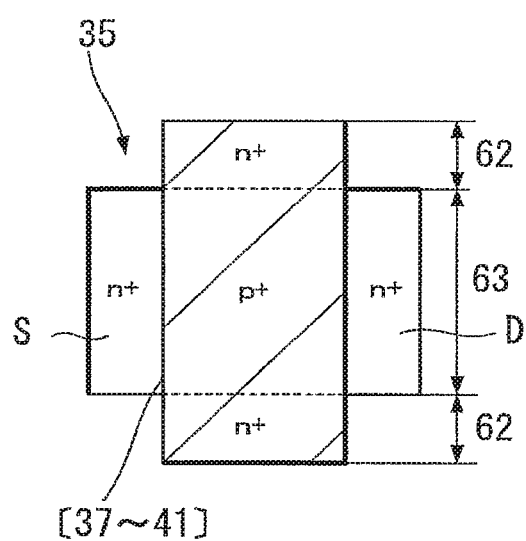
FIG. 19A and FIG. 19B are a plane view and a cross section illustrating another example of a gate electrode of a pixel transistor.
Figure 19B:
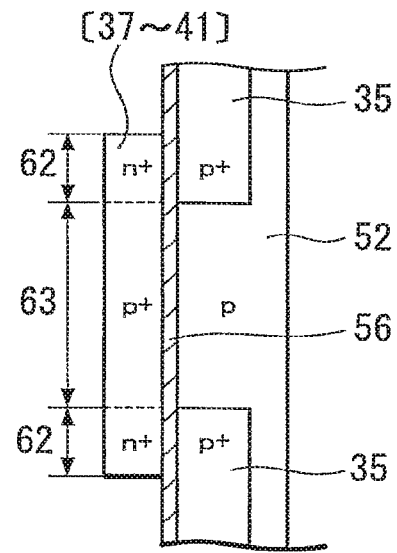

In the example illustrated in FIG. 19A and FIG. 19B, the first portions 63 of the gates electrodes 37 to 41 are formed of an p$^+$ polysilicon into which an p-type impurity has been introduced. The second portions 62 are formed of an n$^+$ polysilicon into which an n-type impurity has been introduced (the first portion and the second portion are formed of the p-type polysilicon and the n-type polysilicon, respectively).

Figure 20A:
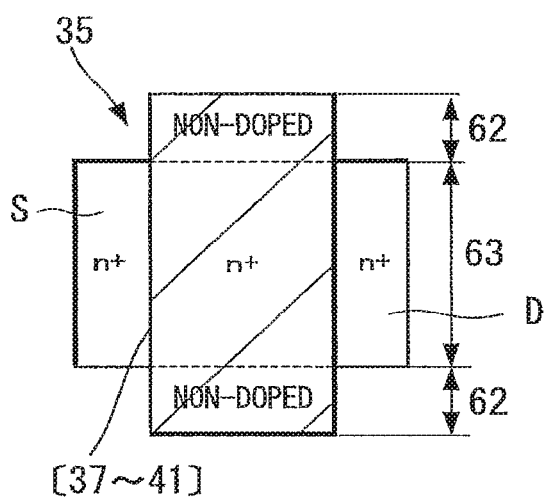
FIG. 20A and FIG. 20B are a plane view and a cross section illustrating another example of a gate electrode of a pixel transistor.
Figure 20B:
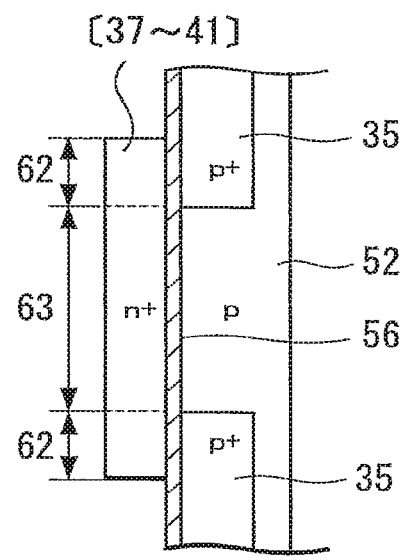

In the example illustrated in FIG. 20A and FIG. 20B, the first portions 63 of the gates electrodes 37 to 41 are formed of a n$^+$ polysilicon into which an n-type impurity has been introduced, and the second portions 62 are formed of non-doped polysilicon (the first portion and the second portion are formed of the n-type polysilicon and the non-doped polysilicon, respectively).

Figure 21A:
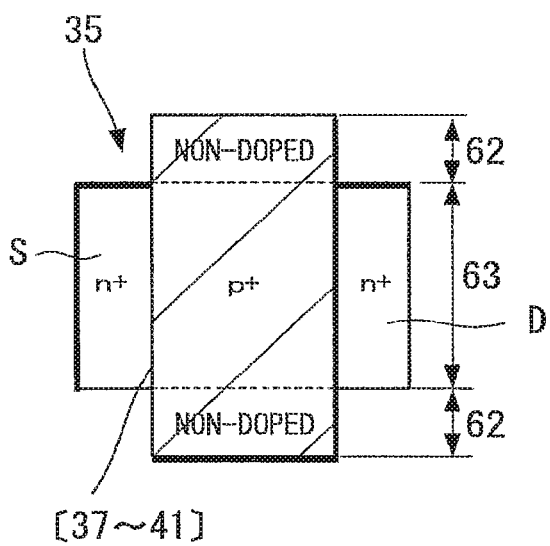
FIG. 21A and FIG. 21B are a plane view and a cross section illustrating another example of a gate electrode of a pixel transistor.
Figure 21B:
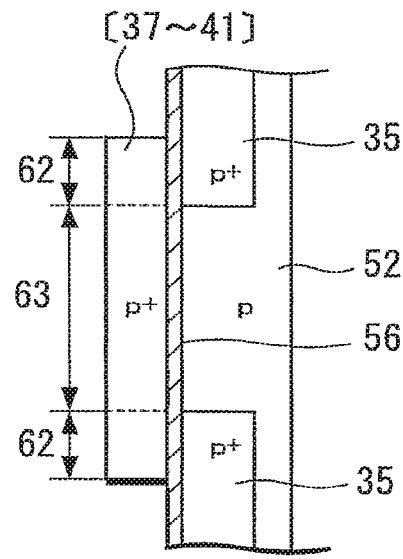

In the example illustrated in FIG. 21A and FIG. 21B, the first portions 63 of the gates electrodes 37 to 41 are formed of p$^+$ polysilicons into which p-type impurities have been introduced, and the second portions 62 are formed of non-doped polysilicon (the first portion and the second portion are formed of the p-type polysilicon and the non-doped polysilicon, respectively).

In a MOS-type image sensor according to the first embodiment of the invention, the insulating films 56, 57 in substantially the same thickness are formed in the region from the channel region 50 of a pixel transistor to the element separation region 35. The insulating film 57 on the element separation region 35 is formed substantially integrally with the gate insulating film 56 by heat oxidation. Accordingly, the insulating films 56, 57 that are flat without any step (i.e., without any seam) are formed from the channel region 50 to the element separation region 35. Because the insulating films 56, 57 are flat, the gate electrodes 37 to 41, in which the protrusion length d1 over the element separation region 35 has a relatively short length, and yet of high reliability and quality can be formed thereupon. That is, film formation of polysilicon, which will be utilized as gate electrodes, can be satisfactorily carried out, and patterning of a minute pattern can be carried out. Therefore, gate electrodes having no air hole in the electrode film with high insulating reliability are formed. Thereby, as compared with the known examples adopting the LOCOS element separation, the STI element separation, or the EDI element separation, the photodiodes 32, 33 can be formed in regions closer to the transistor formation region, and the area ratio of the photodiodes 32, 33 per unit pixel area can be increased. Even if the pixel is miniaturized, because it becomes possible to increase the photodiode area, characteristics such as the saturation charge amount, the sensitivity, and the like can be improved.

On the other hand, because the protrusion length d1 extends over the element separation region 35 of the gate electrodes 37 to 41 can have a relatively short length, generation of a parasitic transistor can be prevented between the pixel transistors and the photodiodes. Further, because formation of the p-type semiconductor region 61 of the element separation region 35 can be carried out by self-alignment in the vicinity of the protrusions by means of ion implantation using the gate electrodes 37 to 41 as parts of the mask for ion implantation, the element separation region separating the photodiodes and the transistors can be formed with accuracy.

Figure 15:
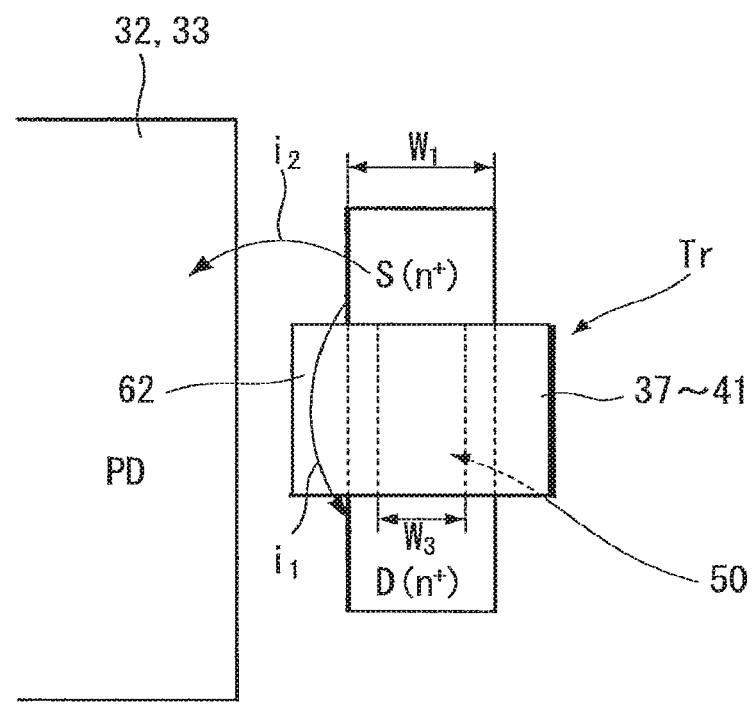
FIG. 15 is a plane view illustrating a state that a leak current is generated.

By making the impurity density of the p-type semiconductor region 61 forming the element separation region 35 equal to or greater than $1 \times 10^{13}$ cm$^{-2}$, for example, on the order of $10^{13}$ cm$^{-2}$, the leak currents i2 from the pixel transistors to the photodiodes 32, 33 and the leak currents i1 due to turning around in the pixel transistors, illustrated in FIG. 15, can be prevented.

Further, as illustrated in FIG. 15, by ion implanting impurity for adjusting the threshold voltage Vt so as to be preferably inside of the width W1 in the channel width direction of the source regions S and the drain regions D in the channel regions 50, the leak currents i1, i2 can be prevented.

In this embodiment, as described above, if the photodiodes 32, 33 are brought to a position closer to the pixel transistors, the leak currents i1, i2 can still be prevented, and hence the gate electrodes 37 to 41 can be formed of polysilicon into which an n-type impurity or an p-type impurity has been introduced as illustrated in FIG. 16A, FIG. 16B, FIG. 17A, and FIG. 17B. Further, as illustrated in FIG. 18A, FIG. 18B, FIG. 19A, FIG. 19B, FIG. 20A, FIG. 20B, FIG. 21A, and FIG. 21B, when forming the first portions 63 corresponding to the channel regions 50, the second portions (protrusions) 62 corresponding to the element separation region 35 (of the gate electrodes 37 to 41 with the materials different from each other), and the gate electrodes 37 to 41 in the combined configuration of n-type, p-type, and non-doped polysilicon, the gate voltage is not applied to the second portions 62 even if gate voltage is applied to the gate electrodes 37 to 41. That is, pn junctions are formed in the boundaries of the first portions 63 and the second portions 62, or the second portions 62 become highly resistive because the second portions 62 are non-doped to be operated essentially as insulators, so that the gate voltage is not applied to the second portions 62. Accordingly, generation of a parasitic transistor making the second portion 62 as a parasitic gate is further prevented. Thereby, leakage of charges from the channel regions to the element separation region 35 or leakage of charges to adjacent pixels can be further surely prevented.

Figure 22:
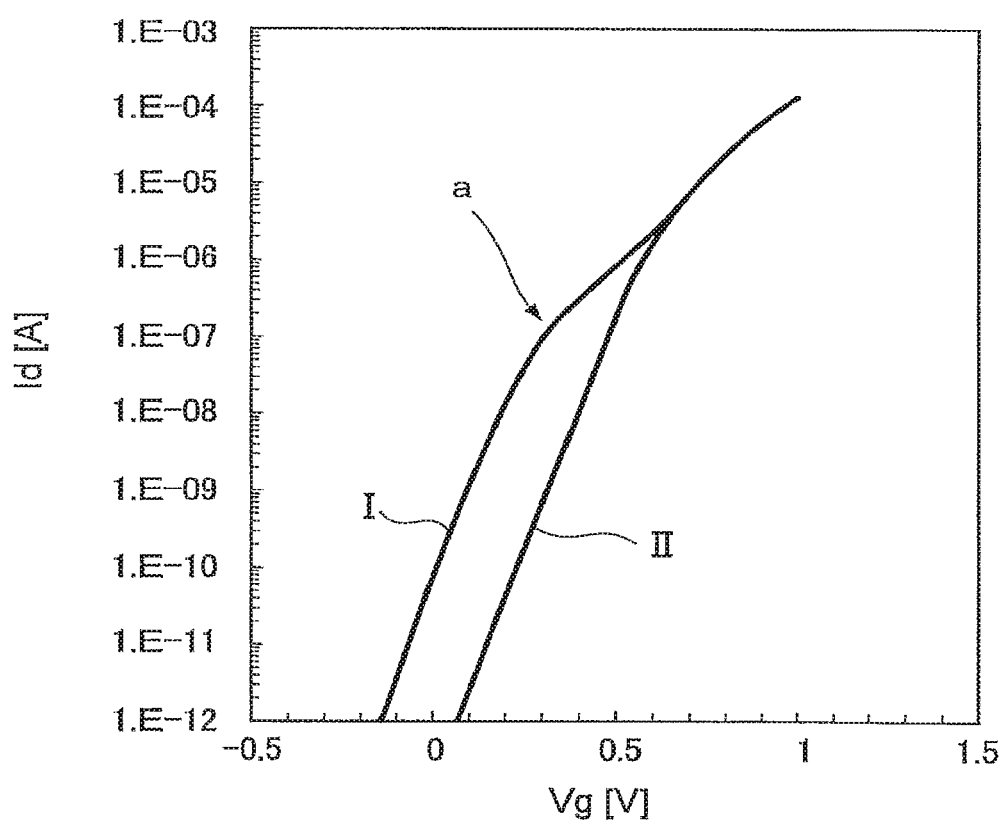
FIG. 22 is a volt-ampere curve of gate voltage Vg and drain current Id comparing a solid-state imaging device according to an embodiment of the invention and a known solid-state imaging device.
Figure 23:
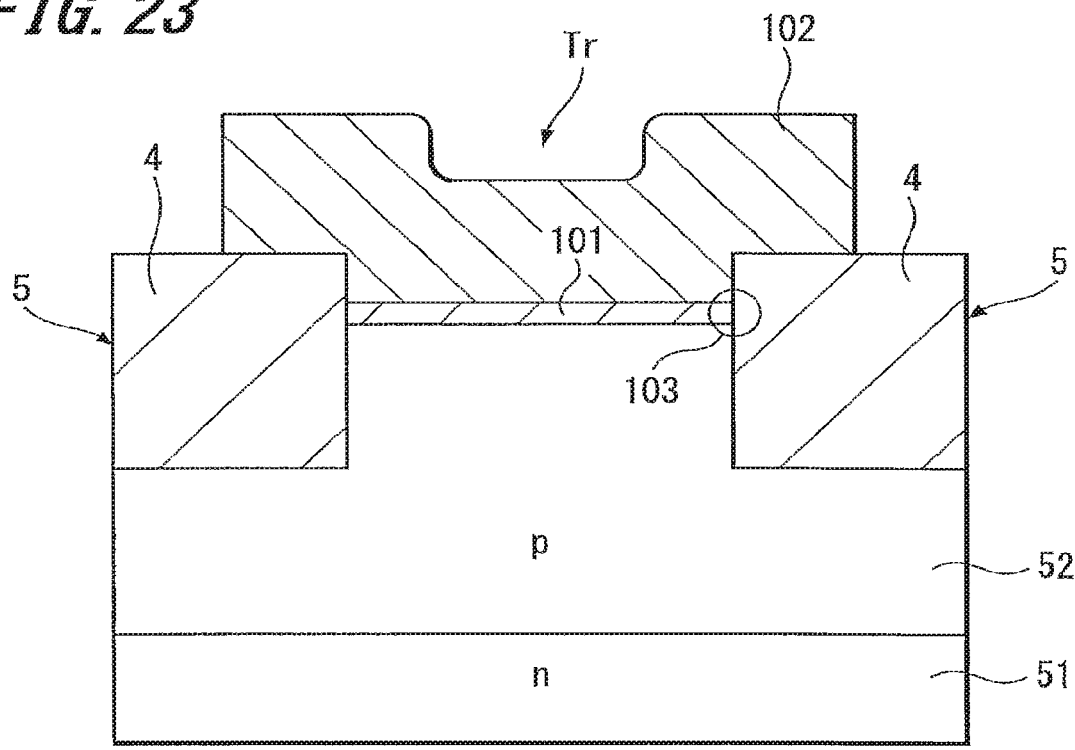
FIG. 23 is a cross section illustrating a pixel transistor having a STI element separation region.
Figure 24:
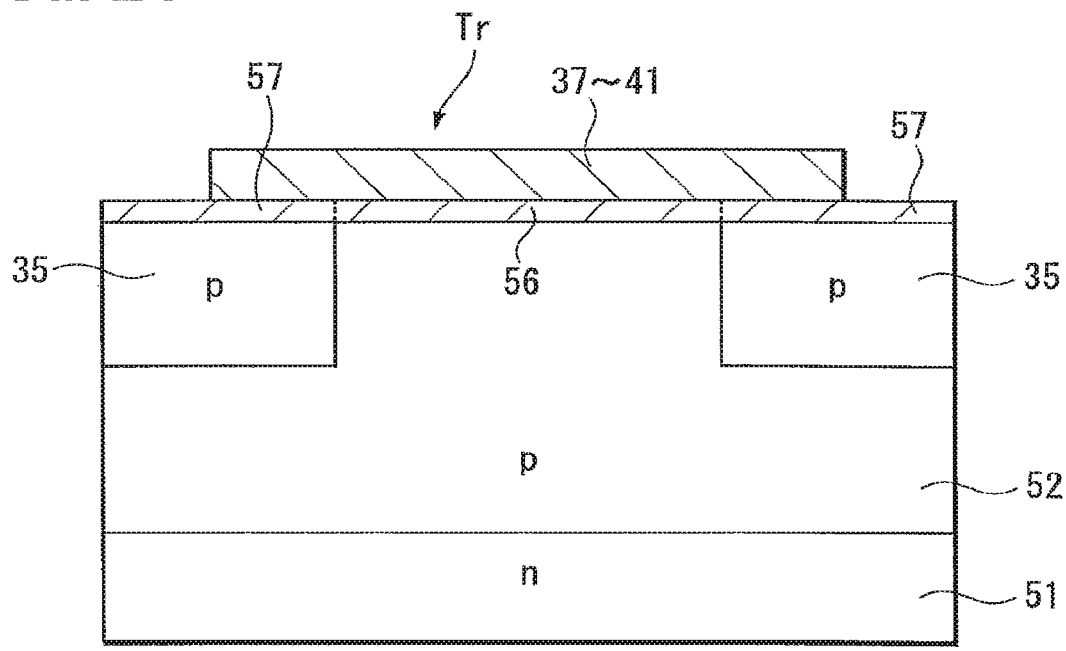
FIG. 24 is a cross section illustrating a pixel transistor having a flat type element separation region.

FIG. 22 illustrates an evaluation result of a volt-ampere characteristic of a gate voltage Vg and a drain current Id of a single pixel transistor. A characteristic curve I indicates a case of a known pixel transistor Tr having an STI element separation region 5 illustrated in FIG. 23, and a characteristic curve II indicates a case of a pixel transistor Tr in this embodiment having a so-called flat-type element separation region 35 illustrated in FIG. 24. In the characteristic curve I, there is a hump "a", because there is a step in a seam 103 of an insulating layer 4 of the STI element separation region 5 and a gate insulating film 101. In the characteristic curve II, there is no hump and the characteristic is linear, because there is no step in the border of an insulating layer 57 of the element separation region 35 and a gate insulating film 56.

As in the STI element separation configuration, if the seam 103 exists between the gate insulating film 101 and the thick insulating film 4, stress and damage are caused and insulating reliability is deteriorated. Therefore, electrons are trapped and de-trapped in the boundary face of the silicon and the oxide film, so that fluctuation is caused, and based on the fluctuation, 1/f noise becomes easily generated. In contrast, in this embodiment, because the gate insulating film 56 and the insulating film 57 are continuously and flatly formed, there is no seam between the gate insulating film 56 and the insulating film 57 on the element separation region 35, so that the prevention of 1/f noise is remarkably improved. The Vg-Id characteristic of FIG. 22 demonstrates this point.

Figure 25:
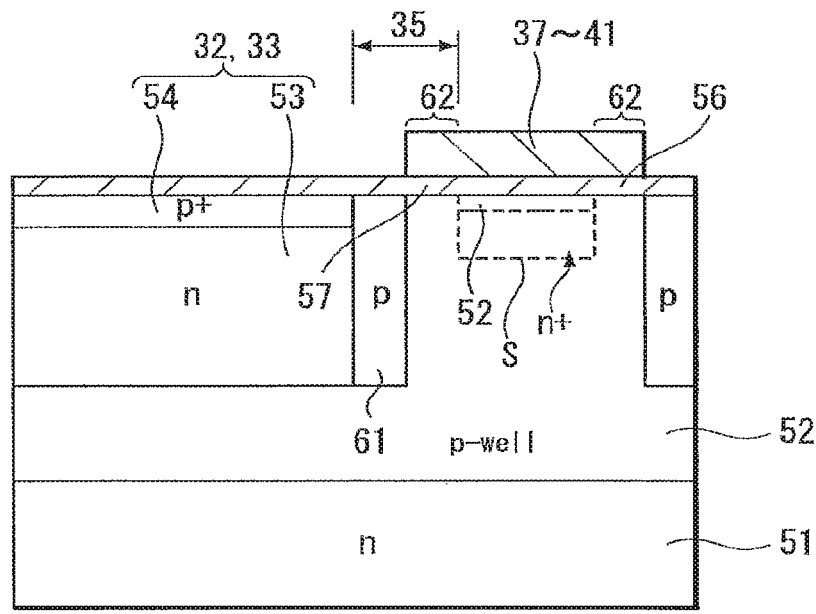
FIG. 25 is a cross section on a line of the principal part of a solid-state imaging device according to the second embodiment of the invention.
Figure 26:
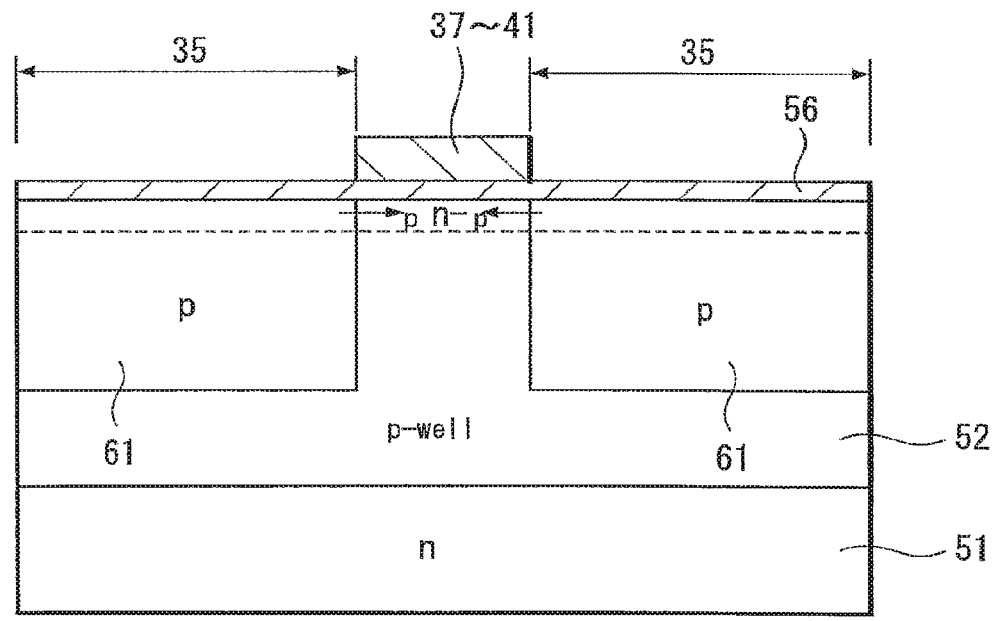
FIG. 26 is a cross section on another line of the principal part of the solid-state imaging device according to the second embodiment of the invention.

FIG. 25 and FIG. 26 illustrate a solid-state imaging device, in this example, a MOS-type image sensor, according to the second embodiment of the invention. In particular, another example of the element separation region 35 is illustrated. FIG. 25 is a cross section on the B-B line of FIG. 13, and FIG. 26 is a cross section on the C-C line of FIG. 13. In this embodiment, after forming the gate electrodes 37 to 41, the p-type impurity region 61 is formed with the first ion implantation of impurity and thereby the element separation region 35 is formed. In this case, the impurity is not implanted under the protrusions 62 extending toward the element separation region 35 of the gate electrodes 37 to 41. Instead, the p-type impurity is diffused again from the element separation region 35 on each side of the gate electrodes 37 to to become a low density p-type region. The p-type semiconductor well region 52 is formed in the n-type silicon substrate 51, however, the n-type of the silicon substrate 51 remains on parts of the semiconductor surface just under the protrusions 62 of the gate electrodes 37 to 41. There is a high possibility that the parts of the n-type semiconductor surface just under the protrusions 62 become low-density p-type regions because of diffusion of the p-type impurity from surroundings. The impurity density of the element separation region 35 is set, as in the previously described embodiment, equal to or below $1 \times 10^{14}$ cm$^{-2}$, preferably, equal to or greater than $1 \times 10^{13}$ cm$^{-2}$. Other parts of the configurations are the same as that in the first embodiment.

In the MOS-type image sensor according to the second embodiment also, it is possible to expand the photodiode area by bringing the photodiodes 32, 33 closer to the pixel transistors, and thereby the characteristics such as the saturation charge amount, the sensitivity, and the like can be enhanced. In addition, the effects similar to those in the first embodiment are produced.

Figure 27:
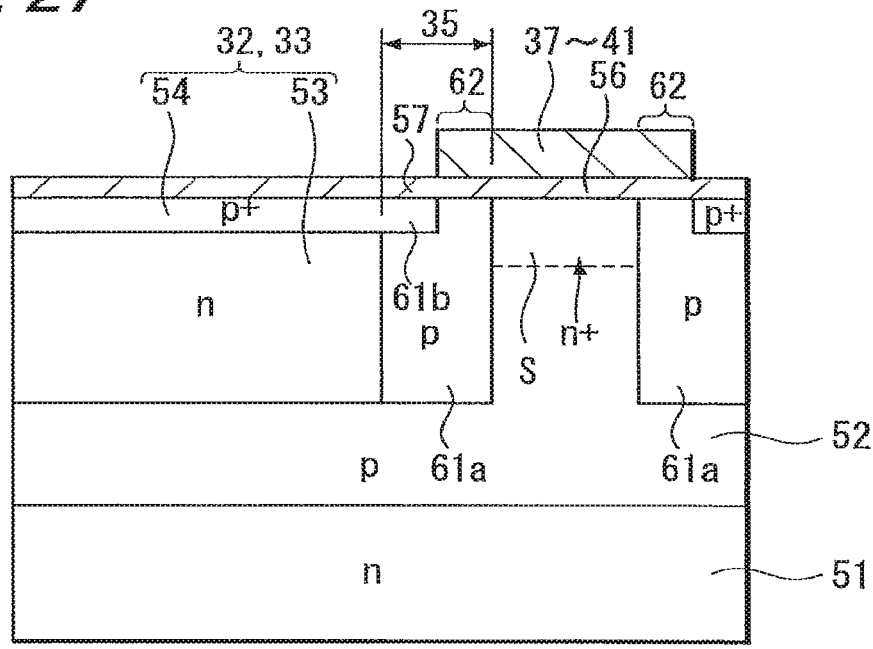
FIG. 27 is a cross section on a line of the principal part of a solid-state imaging device according to the third embodiment of the invention.
Figure 28:
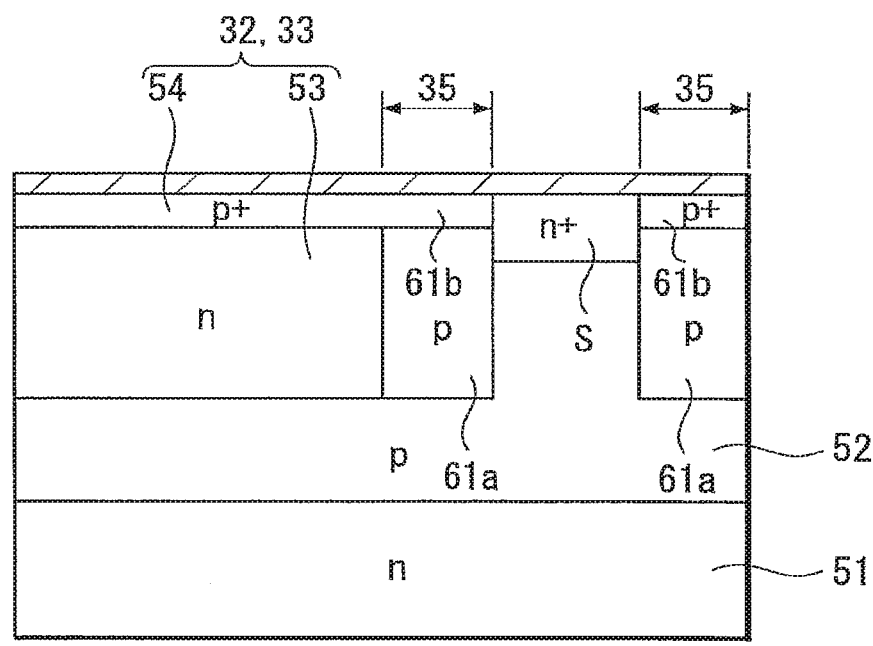
FIG. 28 is a cross section on another line of the principal part of the solid-state imaging device according to the third embodiment of the invention.

FIG. 27 and FIG. 28 illustrate a solid-state imaging device, in this example, a MOS-type image sensor, according to the third embodiment of the invention. The figures illustrate in particular another example of the region including photodiodes, an element separation region, and pixel transistors. FIG. 27 is a cross section on the B-B line of FIG. 13, and FIG. 26 is a cross section on an E-E line of FIG. 13.

In this embodiment, before forming the gate electrodes 37 to 41 of the pixel transistors TrG1, TrG2, TrRST, TrAMP, TrSEL, a first p-type semiconductor region 61a constituting the element separation region is formed by the first ion implantation of p-type impurity. After forming the gate electrodes 37 to 41, the p-type accumulation layers 54 of the photodiodes 31, 32 and a second p-type semiconductor region 61b, which will be utilized as the element separation region, are integrally formed. That is, the n-type charge accumulation region 53 is formed on the photodiode side, and the n-type source regions and drain regions are formed on the pixel transistor side. Then, in the regions corresponding to the element separation region 35 between the photodiodes 32, 33 and the pixel transistors TrRST, TrAMP, TrSEL and the element separation region 35 between the adjacent pixels, the first ion implantation of p-type impurity is thoroughly carried out to form the first p-type semiconductor region 61a. Then, after forming the gate insulating film 56, the insulating film 57 and the gate electrodes 37 to 41, using the gate electrodes 37 to 41 for parts of the mask for ion implantation, the second p-type semiconductor region 61b of the element separation region 35 is formed at the same time, together with the p-type accumulation layer 54, on the surfaces of the element separation region 35 and the n-type charge accumulation regions 53 of the photodiodes 32,33, by the second ion implantation of p-type impurity. That is, by means of the common second ion implantation, the p-type accumulation layer 54 and the second p-type semiconductor region 61b of the element separation region 35 are formed.

In the first ion implantation, similar to the previous embodiments, the dose amount is set on the order of $10^{12}$ cm$^{-2}$. In the second ion implantation also, as in the previous embodiments, the dose amount is set equal to or below $1 \times 10^{14}$ cm$^{-2}$, preferably, equal to or greater than $1 \times 10^{13}$ cm$^{-2}$. As the impurity density is necessary for element separation, it is proper, as described above, if it is equal to or greater than $1 \times 10^{13}$ cm$^{-2}$ in the dose amount, for example, if it is on the order of $10^{13}$ cm$^{-2}$. On the other hand, the impurity density of the p-type accumulation layer 54 is also sufficient if it is equal to or greater than $1 \times 10^{13}$ cm$^{-2}$, for example, if it is on the order of $1 \times 10^{13}$ cm$^{-2}$. Accordingly, it becomes possible to form the accumulation layer 54 and the second p-type semiconductor region 61b of the element separation region by the same ion implantation.

Other parts of the configurations are similar to that described in the first embodiment, so that the description thereof is omitted.

According to the MOS-type image sensor in the third embodiment of the invention, as in the previous embodiments, the areas of the photodiodes 32, 33 can be expanded by bringing the photodiodes 32, 33 in positions closer to the pixel transistors, and thereby the characteristics such as the saturation charge amount, the sensitivity, and the like can be enhanced. In addition, because the second p-type semiconductor region 61b and the p-type accumulation layer 54 on the photodiode side are continuously and integrally formed by means of the second ion implantation for forming the element separation region 35, pixels of high degree of accuracy can be obtained. That is, as compared with the case that three times of ion implantation are carried out, that is, twice of ion implantation for the element separation region 35 and ion implantation for the p-type accumulation layers 54 of the photodiodes 32, 33, there are advantages that the positional deviation caused when the ion implantation is carried out becomes less by one time and superimposition of the photodiode 32, 33 and the element separation region 35 becomes unnecessary. Therefore, expansion of the areas of the photodiode 32, 33 is assured that much. Further, the effects similar to those in the first embodiment can be obtained.

Figure 29:
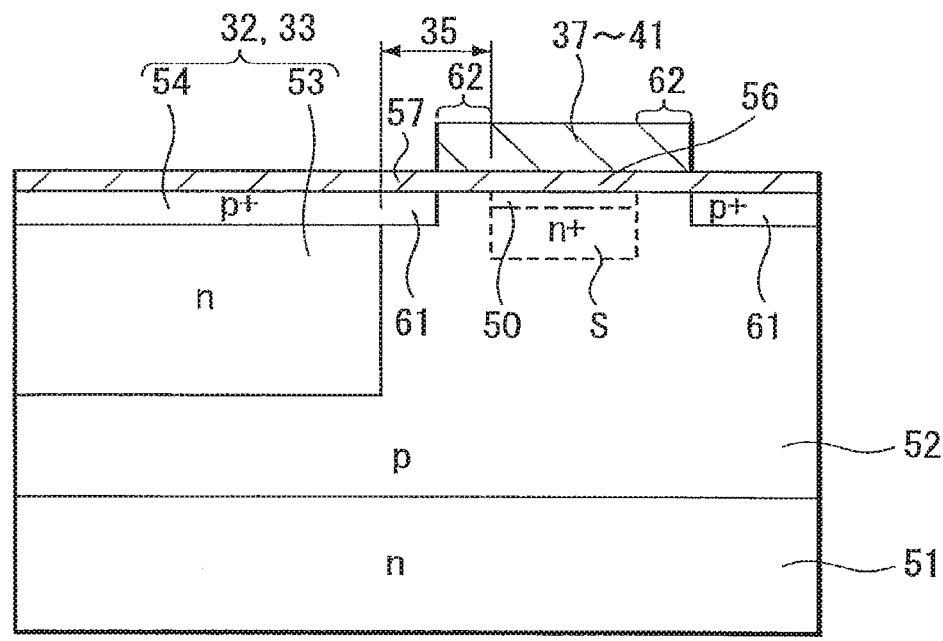
FIG. 29 is a cross section on a line of the principal part of a solid-state imaging device according to the fourth embodiment of the invention.
Figure 30:
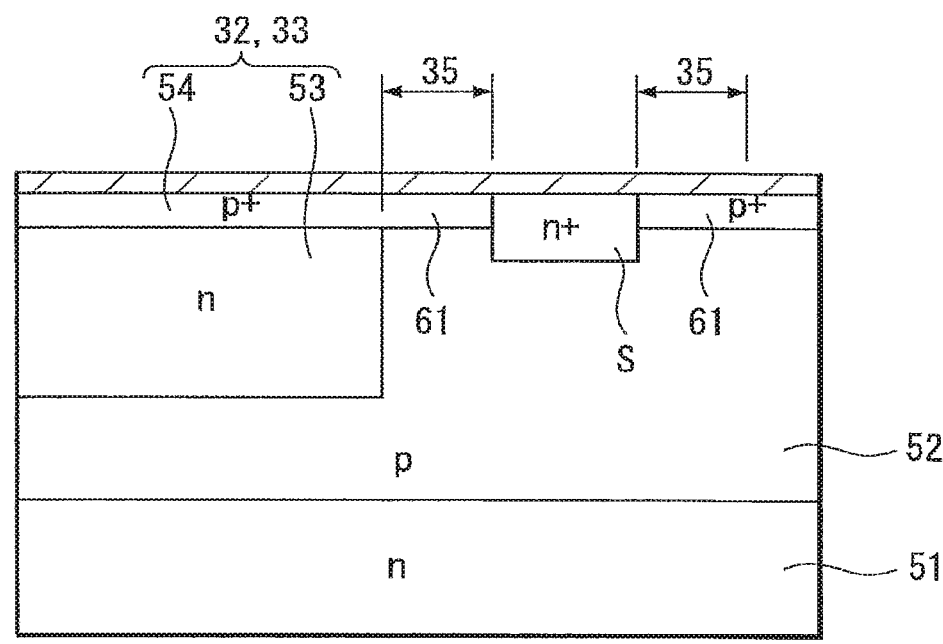
FIG. 30 is a cross section on another line of the principal part of the solid-state imaging device according to the fourth embodiment of the invention.

FIG. 29 and FIG. 30 illustrate a solid-state imaging device, in this example, a MOS-type image sensor, according to the fourth embodiment of the invention. In particular, another embodiment of a region including photodiodes, an element separation region, and pixel transistors is illustrated.

FIG. 29 is a cross section on the B-B line of FIG. 13, and FIG. 30 is a cross section on the E-E line of FIG. 13.

In this embodiment, after forming the gate electrodes 37 to 41, the p-type accumulation layers 54 of the photodiodes 32, 33 and the p-type semiconductor region 61 that becomes the element separation region 35 are integrally formed by the first ion implantation of p-type impurity. In this ion implantation, as in the previous embodiments, the dose amount is set equal to or below $1 \times 10^{14}$ cm$^{-2}$, preferably equal to or greater than $1 \times 10^{13}$ cm$^{-2}$ on the order of $10^{13}$ cm$^{-2}$. In this case, the p-type impurity is not implanted under the protrusions 62 toward the element separation region 35 of the gate electrodes 37 to 41. However, in the following process, the p-type impurity from the surrounding element separation region 35 is diffused under the protrusions 62 of the gate electrodes 37 to 41.

Other parts of the configurations are substantially the same as that described with reference to FIG. 27 and FIG. 28 and that in the first embodiment, and the descriptions thereof are thus omitted.

In the MOS-type image sensor according to the fourth embodiment also, the areas of the photodiodes 32, 33 can be expanded by bringing the photodiodes 32, 33 closer to the pixel transistors, and the characteristics such the saturation charge amount, the sensitivity, and the like can be enhanced. In addition, because the p-type semiconductor region 61 of the element separation region 35 and the p-type accumulation layer 54 on the photodiode side are continuously and integrally formed by one time of ion implantation of the p-type impurity, as compared with the case having twice of ion implantation, the number of processes decreases and production becomes simplified. Therefore, pixels of high degree of accuracy can be obtained. In addition, the effects similar to those in the first embodiment are produced.

Figure 31:
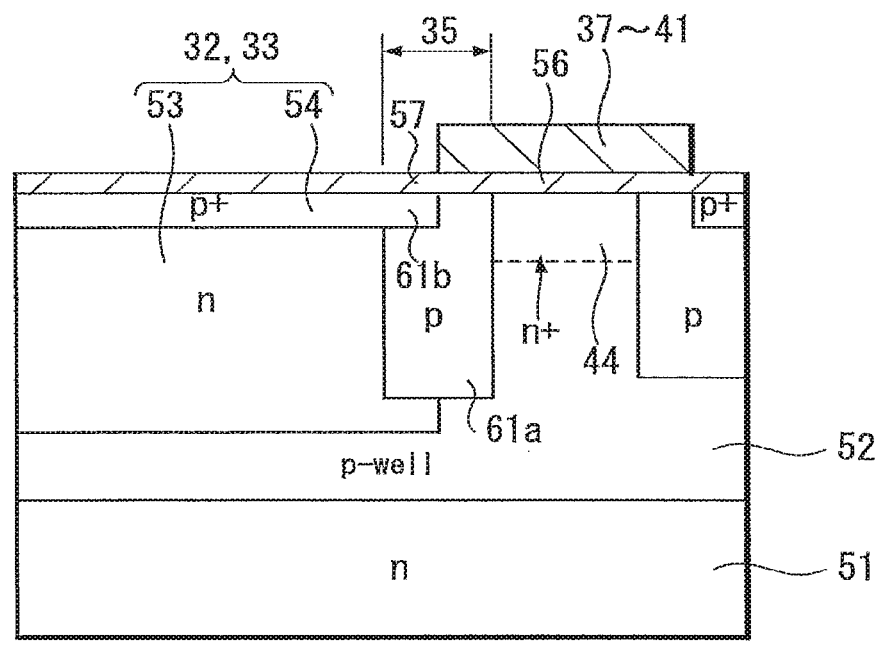
FIG. 31 is a cross section of the principal part of a solid-state imaging device according to the fifth embodiment of the invention.

FIG. 31 illustrates a solid-state imaging device, in this example, a MOS image sensor, according to the fifth embodiment of the invention. In particular, a region including photodiodes, an element separation region, and pixel transistors is illustrated. FIG. 31 is a cross section on the B-B line of FIG. 13.

In this embodiment, before forming the gate electrodes 37 to 41 of the pixel transistors, the first ion implantation of an p-type impurity is carried out to form the first p-type semiconductor region 61a of the element separation region 35. After forming the gate electrodes 37 to 41, the second ion implantation of an p-type impurity is carried out to integrally form the p-type impurity region 61b of the element separation region 35 and the p-type accumulation layers 54 of the photodiodes 32, 33. Further, in this embodiment, the n-type charge accumulation regions 53 of the photodiodes 32, 33 are formed to extend to the areas under the element separation region 35. The first and second p-type semiconductor regions 61a, 61b of the element separation region 35 are formed after the p-type charge accumulation regions 53 of the photodiode 32, 33 have been formed.

In the first ion implantation, as in the previously described embodiments, the dose amount is set on the order of $10^{12}$ cm$^{-2}$. In the second ion implantation also, as in the previously described embodiments, the dose amount is set equal to or below $1 \times 10^{14}$ cm$^{-2}$, preferably equal to or greater than $1 \times 10^{13}$ cm$^{-2}$. As the impurity density necessary for element separation, as described above, there will be no problem if it is equal to or below $1 \times 10^{14}$ cm$^{-2}$, for example, on the order of $10^{13}$ cm$^{-2}$.

Other parts of the configurations are substantially the same as that described in the first embodiment, and the descriptions thereof are thus omitted.

According to the MOS-type image sensor in the fifth embodiment of the invention, because the n-type charge accumulation regions 53 of the photodiodes 32, 33 are formed to be extended to the regions under the element separation region 35 (i.e., the p-type semiconductor region 61a), it becomes possible to further bring the photodiodes 32, 33 close to the pixel transistors to expand the areas of the photodiodes 32, 33. Accordingly, the characteristics such as the saturation charge amount, the sensitivity, and the like can be further enhanced. Further, because the p-type accumulation layer 53 and the second p-type semiconductor region 61b are formed continuously and integrally, the effects similar to those described in the third and first embodiments are produced.

Figure 32:
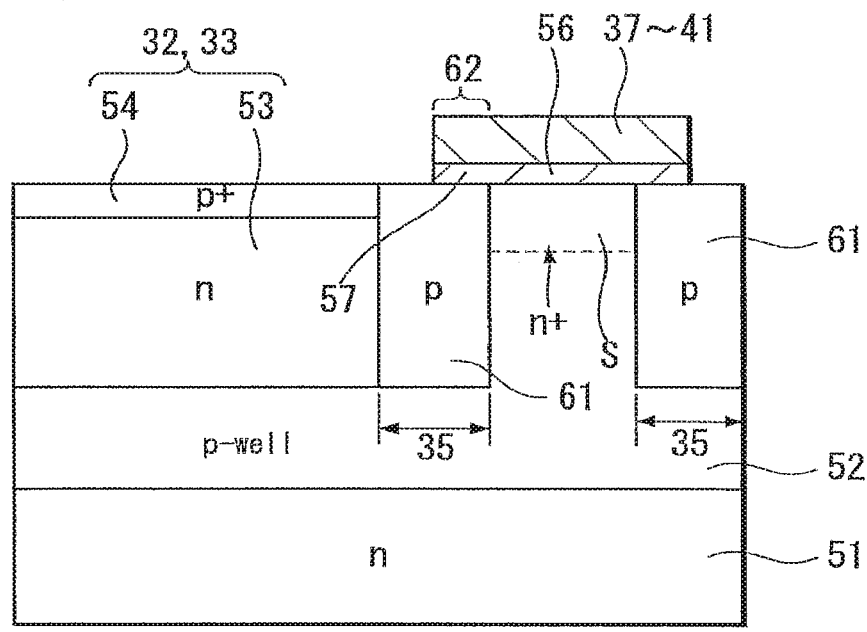
FIG. 32 is a cross section of the principal part of a solid-state imaging device according to the sixth embodiment of the invention.

FIG. 32 illustrates a solid-state imaging device, in this example, a MOS-type image sensor, according to the sixth embodiment of the invention. FIG. 32 particularly illustrates an example of a region including photodiodes, an element separation region, and pixel transistors. FIG. 30 is a cross section on the B-B line of FIG. 13.

In this embodiment, an insulating film 57 having the film thickness substantially the same as that of the gate insulating film 56 is formed only on parts of the element separation region 35 under the protrusions 62 of the gate electrodes 37 to 41. In the region including parts of the element separation region 35 other than the parts under the protrusions 62 and the photodiodes 32, 33, an insulating film having the thickness different from that of the gate insulating film 56, for example, an insulating film thicker than the gate insulating film 56 can be formed.

Other parts of the configuration are substantially the same as those described in the first embodiment with reference to FIG. 7, and the descriptions thereof are thus omitted.

According to the MOS-type image sensor in the sixth embodiment of the invention, similar to the previously described embodiments, the areas of the photodiodes 32, 33 can be expanded by bringing the photodiodes 32, 33 closer to the pixel transistors, and thereby the characteristics such as the saturation charge amount, the sensitivity, and the like can be enhanced.

Figure 33:
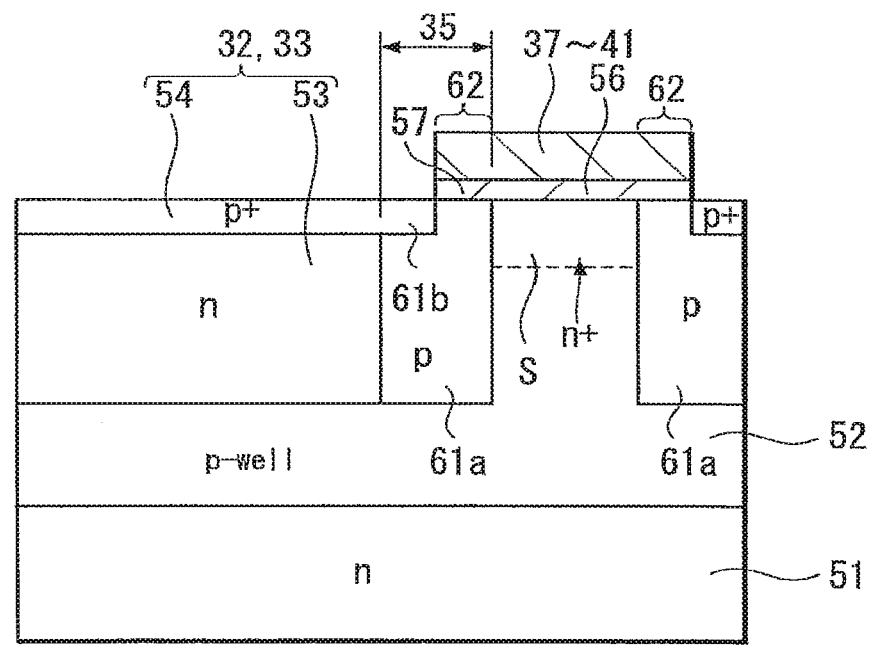
FIG. 33 is a cross section of the principal part of a solid-state imaging device according to the seventh embodiment of the invention.

FIG. 33 illustrates a solid-state imaging device, in this example, a MOS-type image sensor, according to the seventh embodiment of the invention. FIG. 33 particularly illustrates an embodiment of a region including photodiodes, an element separation region, and pixel transistors. FIG. 33 is a cross section on the B-B line of FIG. 13.

In this embodiment, before forming the gate electrodes 37 to 41 of the pixel transistors TrG1, TrG2, TrRST, TrAMP, TrSEL, the first p-type semiconductor region 61a constituting the element separation region is formed by the first ion implantation of p-type impurity. After forming the gate electrodes 37 to 41, the p-type accumulation layers 53 of the photodiodes 32, 33 and the second p-type semiconductor region 61b, which will be utilized as the element separation region, are integrally formed by the second ion implantation. The second ion implantation may be carried out after forming sidewalls of the gate electrodes. The second ion implantation is carried out at least after formation of the gate electrodes. Further, similar as described with reference to FIG. 32, the insulating film 57 having the thickness substantially the same as that of the gate insulating film 56 is formed only on parts of the element separation region 35 under the protrusions of the gate electrodes 37 to 41. It is possible to form an insulating film having the film thickness different from that of the gate insulating film (i.e., an insulating film thicker than the gate insulating film on parts of the element separation region 35, other than the parts under the protrusions 62 or in the region including the parts of the element separation region 35 other than the parts under the protrusions 62 and the photodiodes 32, 33).

Other parts of the configurations are substantially the same as those described with reference to the first embodiment and FIG. 27, and the descriptions thereof are thus omitted.

According to the MOS-type image sensor according to the seventh embodiment of the invention, similarly as described above, the areas of the photodiodes 32, 33 can be expanded by bringing the photodiodes 32, 33 in positions closer to the pixel transistors and the characteristics such as the saturation charge amount, the sensitivity, and the like can be enhanced. In addition, because the second p-type semiconductor region 61b and the p-type accumulation layers 54 of the photodiodes 32, 33 are continuously and integrally formed by the second ion implantation for the purpose of forming the element separation region 35, pixels of high order of accuracy can be obtained.

Figure 34:
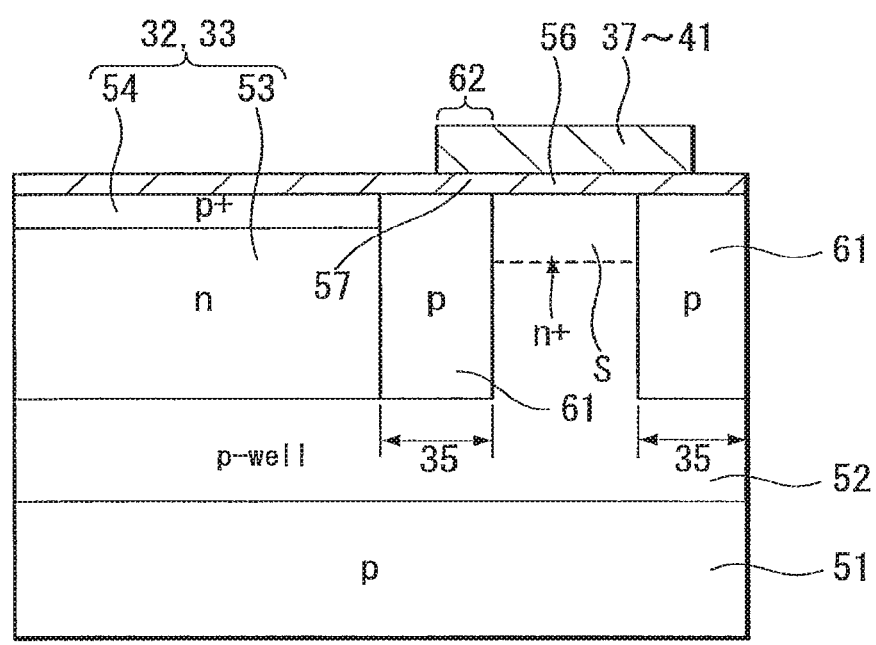
FIG. 34 is a cross section of the principal part of a solid-state imaging device according to the eighth embodiment of the invention.

FIG. 34 illustrates a solid-state imaging device, in this embodiment, a MOS-type image sensor, according to the eighth embodiment of the invention. FIG. 34 particularly illustrates an example of a region including photodiodes, an element separation region, and pixel transistors. FIG. 34 is a cross section on the B-B line of FIG. 13.

In this embodiment, a p-type silicon substrate is used for the semiconductor substrate 51. The configuration other than this is substantially the same as that described in the first embodiment with reference to FIG. 7, and the descriptions thereof are thus omitted.

In the MOS-type image sensor according to the eighth embodiment of the invention, similar as in the previously described embodiments, the areas of the photodiodes 32, 33 can be expanded by bringing the photodiodes 32, 33 in positions closer to the pixel transistors, and thereby the characteristics such as the saturation charge amount, the sensitivity, and the like can be enhanced.

Now, description will be made with respect to manufacturing methods of a solid-state imaging device, in this example, a MOS-type image sensor, according to embodiments of the invention. In particular, the description will be made mainly with respect to manufacturing methods of the element separation region.

Figure 35A:
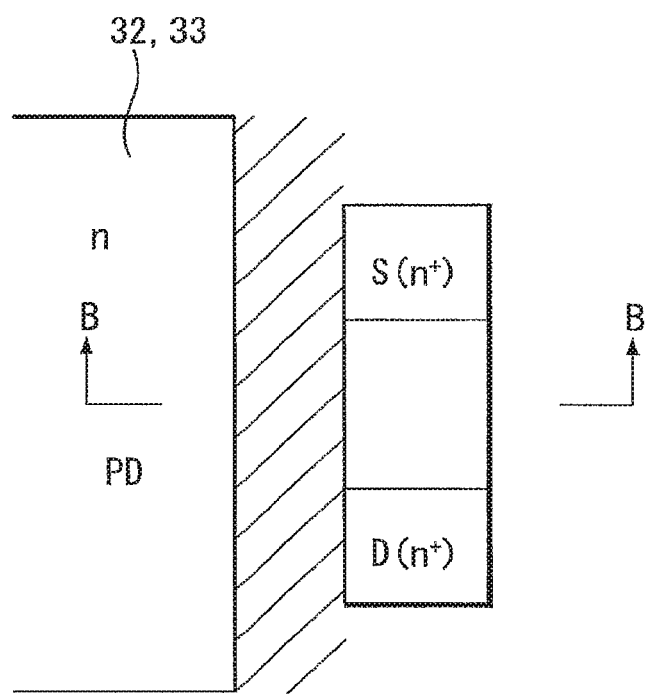
FIG. 35A and FIG. 35B are plane views for explaining processes of a manufacturing method of a solid-state imaging device, according to the first embodiment of the invention.
Figure 35B:
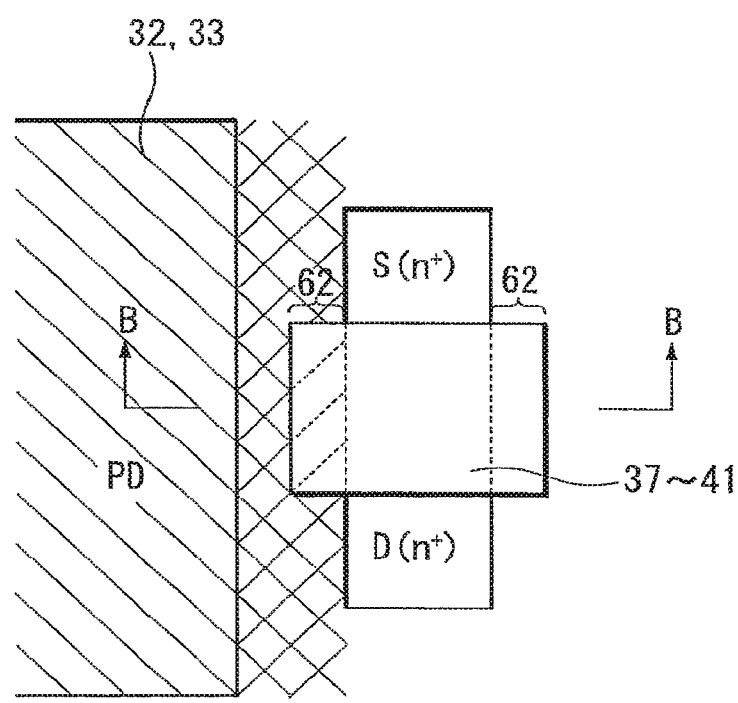
Figure 36A:
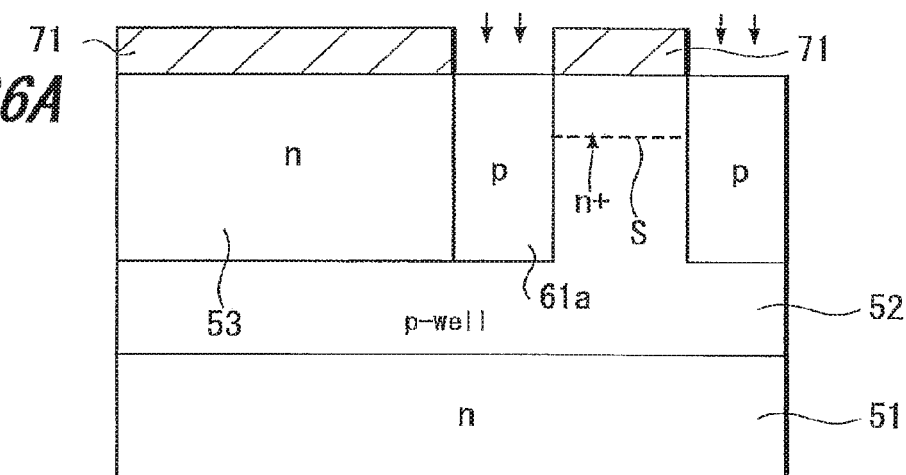
FIG. 36A, FIG. 36B, and FIG. 36C are cross sections for explaining the processes of the manufacturing method of a solid-state imaging device, according to the first embodiment of the invention.
Figure 36B:
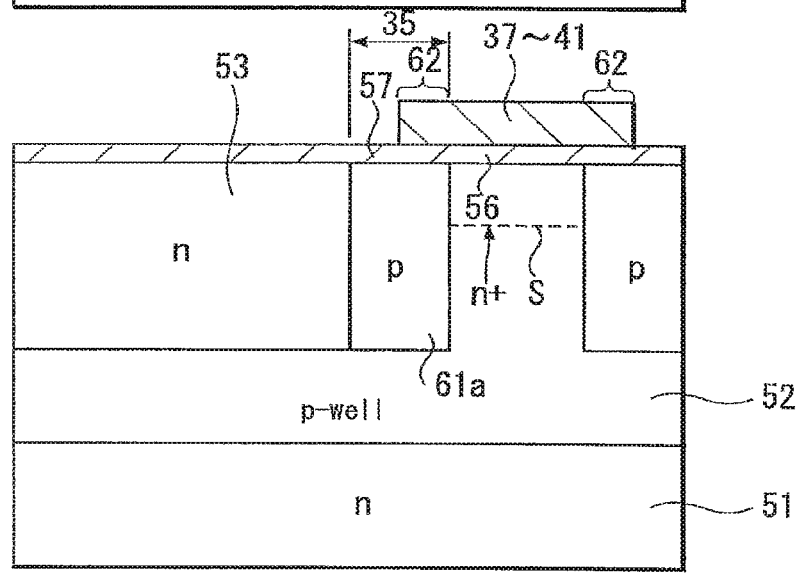
Figure 36C:
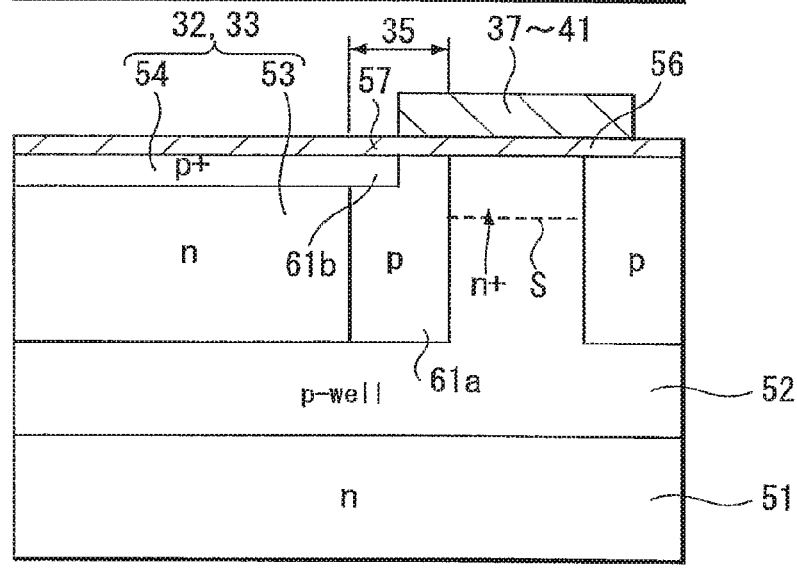

FIG. 35A, FIG. 35B, FIG. 36A, FIG. 36B, and FIG. 36C illustrate a manufacturing method of a MOS-type image sensor according to the first embodiment of the invention. FIG. 36A, FIG. 36B, and FIG. 36C are cross sections along B-B lines of FIG. 35A and FIG. 35B. FIG. 35A and FIG. 35B are cross sections along the B-B line of FIG. 13.

First, as illustrated in FIG. 35A and FIG. 36A, in the first conductivity-type semiconductor substrate 51, for example, in an n-type silicon semiconductor substrate, the p-type semiconductor well region 52 as the second conductivity-type is formed. The n-type charge accumulation regions 53 of the photodiodes 32, 33 are formed in the p-type semiconductor well region 52, and also the source regions S and the drain regions D of the pixel transistors are formed. Subsequently, the first ion implantation of p-type impurity, for example, boron is carried out throughout the region that becomes the element separation region, for example, through a mask 71 by means of an insulating film formed on the surface of the substrate 51, to form the first p-type semiconductor region 61a of relatively low density. In this first ion implantation, the dose amount is set for example at about $1 \times 10^{12}$ cm$^{-2}$.

Next, as illustrated in FIG. 36B, the gate insulating film 56 and the insulating film 57 on the element separation region 35 and the n-type charge accumulation regions 53 of the photodiodes 32, 33 are simultaneously formed in the same thermal oxidation process. That is, essentially, a gate insulating film is formed in the whole region of the photodiodes 32, 33, the element separation region 35, and the pixel transistors. Then, the gate electrodes 37 to 41 are formed, for example, with a polysilicon film.

Next, as illustrated in FIG. 35B and FIG. 36C, the second ion implantation of the p-type impurity, for example, boron is carried out using the gate electrodes 37 to 41 as parts of the ion implantation mask, and the p-type accumulation layers 54 on the surfaces of the n-type charge accumulation regions 53 and the second p-type semiconductor region 61b of the element separation region 35 are continuously and simultaneously formed. In this second ion implantation, the dose amount is set at $1 \times 10^{14}$ cm$^{-2}$ or below, preferably at $1 \times 10^{13}$ cm$^{-2}$ or greater, for example at about $1 \times 10^{13}$ cm$^{-2}$. The element separation region 35 is formed by the first and second p-type semiconductor regions 61a and 61b. The element separation region 35 is formed between the photodiodes 32, 33 and the pixel transistors TrG1, TrG2, TrRST, TrAMP, TrSEL so as to contact the n-type charge accumulation regions 53 of the photodiodes 32, 33 and the pixel transistors TrG1, TrG2, TrRST, TrAMP, TrSEL.

According to the manufacturing method of a MOS-type image sensor in the first embodiment of the invention, the gate insulating film 56 of the pixel transistors, the insulating film 57 on the element separation region 35, and the photodiodes 32, 33 can be formed in the same thermal oxidation process with the thicknesses thereof made substantially the same. Thereby, when forming the gate electrodes 37 to 41, for example with a polysilicon film, the length d1 of each protrusion 62 extending toward the element separation region 35 can have a relatively short length and yet the gate electrodes 37 to 41 can be formed in good quality. Therefore, the n-type charge accumulation regions 53 of the photodiodes 32, 33 can be formed in a region closer to the formation region of the pixel transistors.

Because the first p-type semiconductor region 61a in low density is formed in the whole region of the element separation region 35 including the parts under the protrusions 62 of the gate electrodes 37 to 41 by the first ion implantation, charges generating from borders between the silicon under the protrusions 62 of the gate electrodes 37 to 41 and the insulating film can be eliminated, thereby decreasing the generation of dark current and white spots can be decreased. On the other hand, because the gate electrodes 37 to 41 function as the parts of the mask in the second ion implantation, the second p-type semiconductor region 61b can be formed in self-alignment in the vicinity of the gate electrodes 37 to 41. As compared with the case that the second p-type semiconductor region 61b of the element separation region 35 and the p-type accumulation layers 54 of the photodiodes 32 33 are formed in separate ion implantation processes, there is no superimposing between the photodiodes 32, 33 and the element separation region 35, so that the layout of the pixel array is formed with accuracy.

With the above-described processes, the photodiodes 32, 33 can be formed with the area ratio per a unit pixel of the photodiodes 32, 33 raised. Accordingly, even if the pixel is miniaturized, it is possible to manufacture a MOS-type image sensor improved in the characteristics, such as the saturation charge amount, the sensitivity, and the like.

Figure 37A:
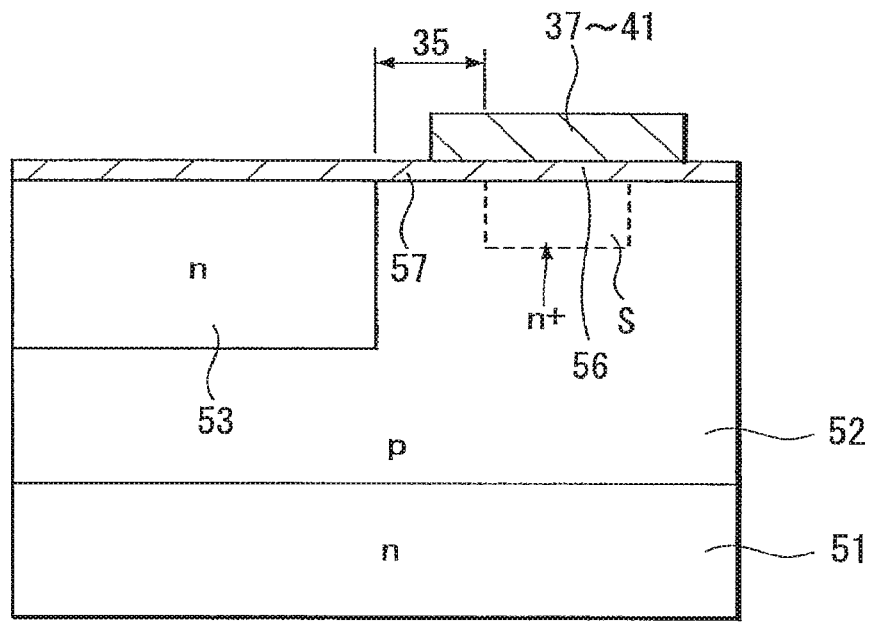
FIG. 37A and FIG. 37B are plane views for explaining processes of a manufacturing method of a solid-state imaging device, according to the second embodiment of the invention.
Figure 37B:
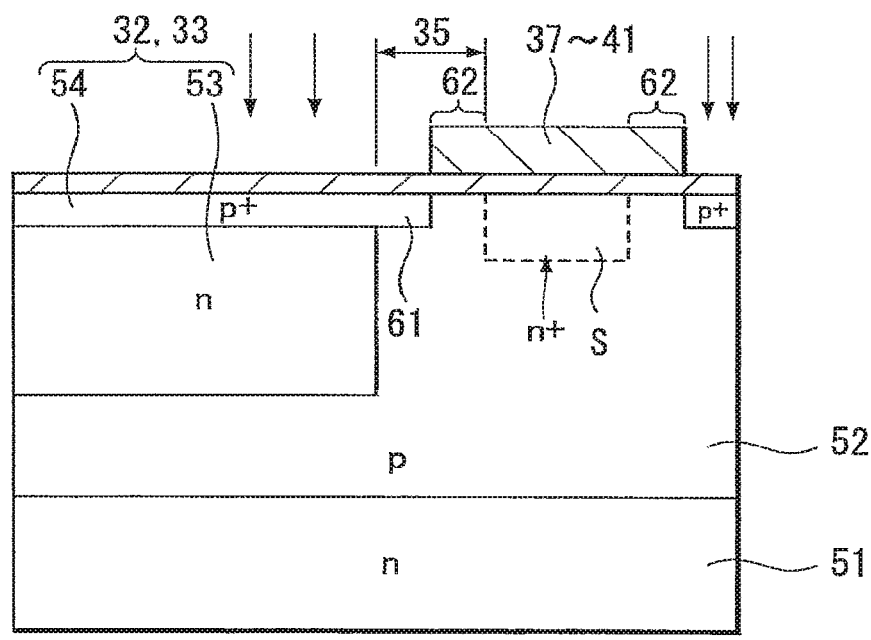

FIG. 37A and FIG. 37B each illustrate a manufacturing method of a MOS-type image sensor, according to the second embodiment of the invention. FIG. 37A and FIG. 37B are cross sections corresponding to FIG. 36A, FIG. 36B, and FIG. 36C. FIG. 37A and FIG. 37B are cross sections along the B-B line of FIG. 13.

First, as illustrated in FIG. 37A, in the first conductivity-type semiconductor substrate 51, for example, the p-type semiconductor well region 52 as the second conductivity-type is formed in an n-type semiconductor region. In this p-type semiconductor well region 52, the n-type charge accumulation regions 53 of the photodiodes 32, 33 are formed, and the source regions S and the drain regions D of the pixel transistors are formed as well. Then, the gate insulating film 56, the insulating film 57 on the element separation region 35, and the n-type charge accumulation regions 53 of the photodiodes 32, 33 are simultaneously formed with the same thermal oxidation process. That is, a gate insulating film is essentially formed on the whole region of the photodiodes 32, 33, the element separation region 35, and the pixel transistors. Subsequently, the gate electrodes 37 to 41 by means of a polysilicon film are formed.

Then, as illustrated in FIG. 37B, the first ion implantation of the p-type impurity, for example, boron is carried out, using the gate electrodes 37 to 41 as parts of the ion implantation mask, and the p-type accumulation layer 54 on the surface of the n-type charge accumulation region 53 and the p-type semiconductor region 61 of the element separation region 35 are continuously and simultaneously formed. In this ion implantation, the dose amount is set at $1 \times 10^{14}$ cm$^{-2}$ or below. Preferably, it is set at $1 \times 10^{13}$ cm$^{-2}$ or greater, for example, at about $1 \times 10^{13}$ cm$^{-2}$. The element separation region 35 is formed with the p-type semiconductor region 61 formed by the first ion implantation. The element separation region 35 is formed between the photodiodes 32, 33 and the pixel transistors so as to contact the n-type charge accumulation regions 54 of the photodiodes 32, 33 and the pixel transistors.

According to the manufacturing method of a MOS-type image sensor in the second embodiment of the invention, as in the first embodiment described above, the gate insulating film 56 of the pixel transistors and the insulating film 57 on the element separation region 35 and the photodiodes 32, 33 are formed in substantially the same thickness by the same thermal oxidation process. Thereby, when forming the gate electrodes 37 to 41, for example, with a polysilicon film, the length d1 of the protrusions 62 extending toward the element separation region 35 can have a relatively short length, and yet the gate electrodes 37 to 41 can be formed in good quality. Therefore, it is possible to form the n-type charge accumulation regions 53 of the photodiodes 32, 33 closer to the pixel transistor formation region.

Because the element separation region 35 by means of the p-type semiconductor region 61 and the p-type accumulation layers 54 of the photodiodes 32, 33 are simultaneously formed by the first ion implantation, the number of manufacturing processes becomes less and manufacturing becomes easier. In addition, the effects similar to those in the manufacturing method according to the first embodiment are produced.

FIG. 38A, FIG. 38B, FIG. 39C, and FIG. 39D illustrate a manufacturing method of a MOS-type image sensor, according to the third embodiment of the invention. FIG. 38A, FIG. 38B, FIG. 39C, and FIG. 39D are cross sections corresponding to FIG. 36A, FIG. 36B, and FIG. 36C. FIG. 38A, FIG. 38B, FIG. 39C, and FIG. 39D are cross sections along the B-B line of FIG. 13.

Figure 38A:
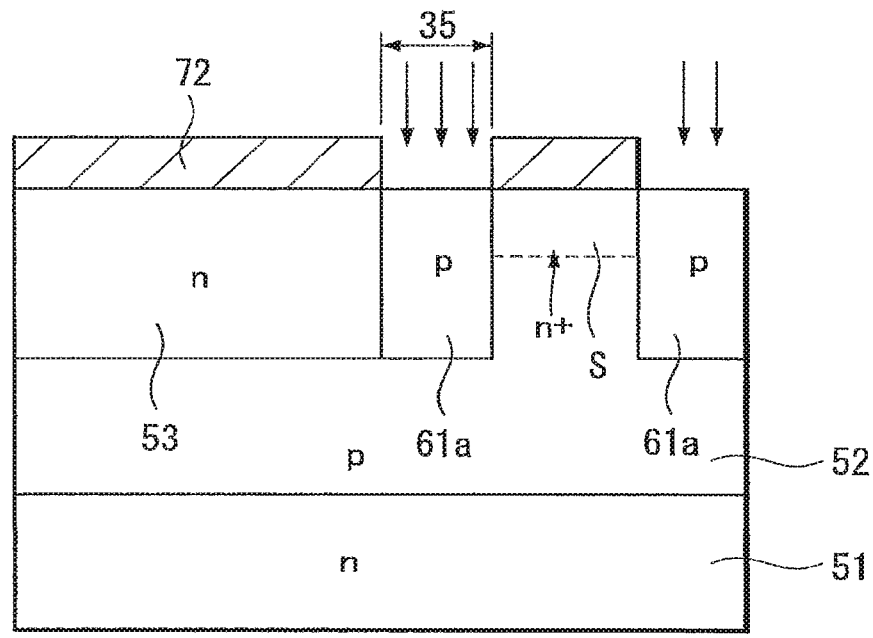
FIG. 38A and FIG. 38B are cross sections for explaining a first part of processes of a manufacturing method of a solid-state imaging device, according to the third embodiment of the invention.

First, as illustrated in FIG. 38A, the p-type semiconductor well region 52 as the second conductivity-type is formed in the first conductivity-type semiconductor substrate 51, for example, in an n-type silicon semiconductor substrate. The n-type charge accumulation regions 53 of the photodiodes are formed in the p-type semiconductor well region 52, and also the source regions S and the drain regions D of the pixel transistors are formed. Subsequently, the first ion implantation of p-type impurity, for example, boron is carried out to the whole region that becomes the element separation region 35, through a mask 72 by means of an insulating film formed on the substrate surface, to form the first p-type semiconductor region 61a of relatively low density. For the first ion implantation, for example, the dose amount is set at about $1\times10^{12}$ cm$^{-2}$.

Figure 38B:
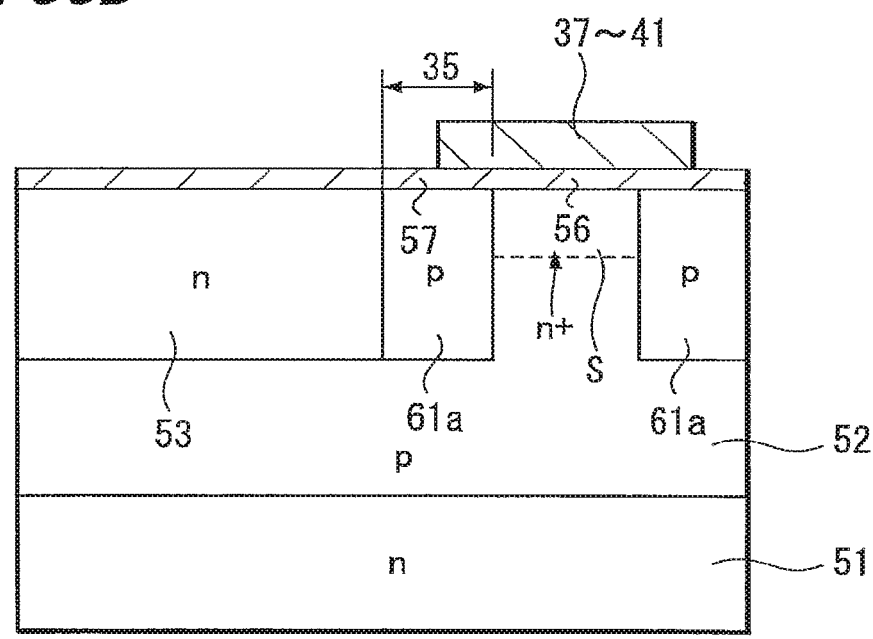

Then, as illustrated in FIG. 38B, the gate insulating film 56 and the insulating film 57 on the element separation region 35 and the n-type charge accumulation regions 53 of the photodiodes are simultaneously formed with the same thermal oxidation process. That is, essentially, a gate insulating film is formed on the whole region of the photodiodes, 32, 33, the element separation region 35, and the pixel transistors. Subsequently, the gate electrodes 37 to 41 for example by means of a polysilicon film are formed.

Next, as illustrated in 39C, a registration mask 73 is formed on the n-type charge accumulation regions 53 and the pixel transistor region (including the source regions, the drain regions, and the channel regions). Using this registration mask 73 and parts (the protrusions 62) of the gate electrodes 37 to 41 as the ion implantation mask, the second ion implantation of p-type impurity, for example, boron is carried out to areas that become the element separation region 35, thereby forming the second p-type semiconductor region 61b of relatively high density. The second p-type semiconductor region 61b is not introduced under the protrusions 62 of the gate electrodes 37 to 41. For the second ion implantation, the dose amount is set at $1\times10^{14}$ cm$^{-2}$ or below. Preferably, it is set at $1\times10^{13}$ cm$^{-2}$ or above, for example, at about $1\times10^{13}$ cm$^{-2}$. The element separation region 35 is formed by these first and second p-type semiconductor regions 61a, 61b. This element separation region 35 is formed so as to contact the n-type charge accumulation regions 53 of the photodiodes 32, 33 and the pixel transistors, between the photodiodes 32, 33 and the pixel transistors.

Figure 39C:
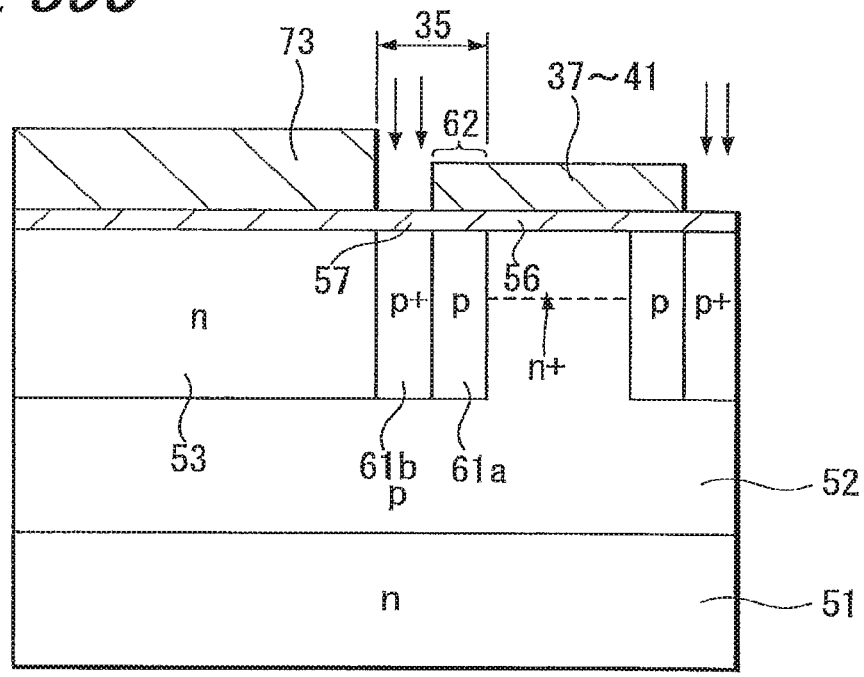
FIG. 39C and FIG. 39D are cross sections for explaining a second part of the processes of the manufacturing method of a solid-state imaging device, according to the third embodiment of the invention.
Figure 39D:
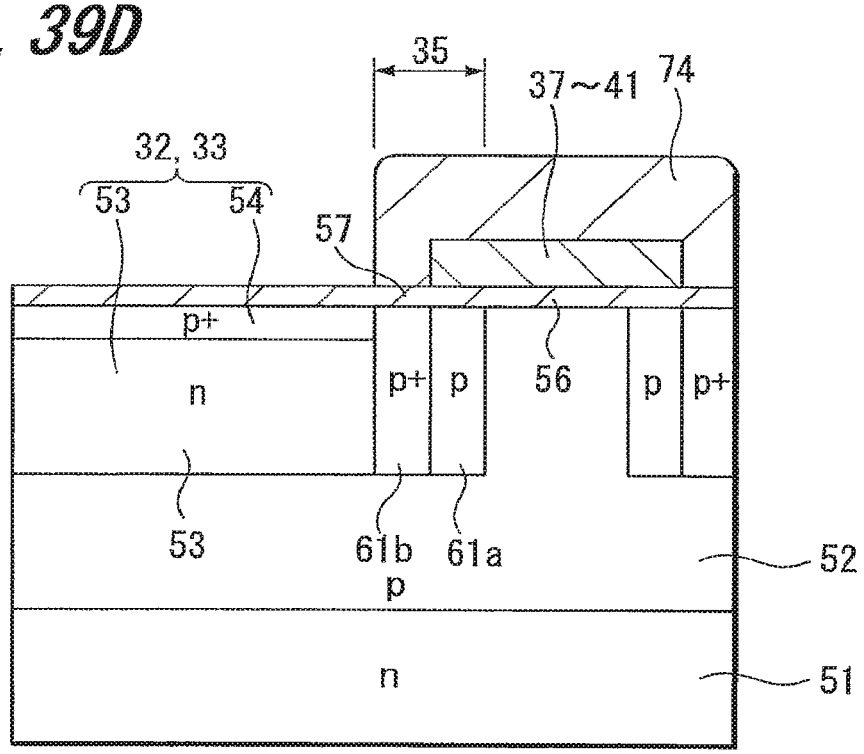

Then, as illustrated in FIG. 39D, a registration mask 74 is formed in the region except the region of the photodiodes 32, 33, and through this registration mask 74, the third ion implantation of p-type impurity, for example, boron is carried out, and thereby the p-type accumulation layer 54 is formed on the surface of the n-type charge accumulation region 53. For the third ion implantation, the dose amount is set at $1\times10^{14}$ cm$^{-2}$ or below, for example, at about $1\times10^{13}$ cm$^{-2}$. The photodiodes 32 and 33 include the p-type accumulation layer 54 and the n-type charge accumulation region 53.

According the manufacturing method of a MOS-type image sensor according to the third embodiment of the invention, as in the previously described embodiments, the gate insulating film 56 of the pixel transistors and the insulating film 57 of the element separation region 35 and the photodiodes 32, 33 can be formed in substantially the same thickness by the same heat oxidation process. Thereby, when forming the gate electrodes 37 to 41 by means of a polysilicon film, the length d1 of each protrusion 62 extending toward the element separation region 35 can have a relatively short length and yet, the gate electrodes 37 to 41 can be formed in good quality. Therefore, the n-type charge accumulation regions 53 of the photodiodes can be formed closer to the pixel transistor formation region.

With the above-described processes, the photodiodes 32, 33 can be formed with the area ratio thereof per unit pixel area raised. Accordingly, even if the pixel is miniaturized, it is possible to manufacture a MOS-type image sensor enhanced in the characteristics such as the saturation charge amount, the sensitivity, and the like.

Now, a manufacturing method of a MOS-type image sensor according to the fourth embodiment of the invention is described. Although not shown, formation of the first p-type semiconductor region 61a in the third embodiment is omitted. That is, the gate insulating film 56 and the insulating film 57 are formed, and after forming the gate electrodes 37 to 41, a registration mask is formed on the n-type charge accumulation region 53 and the transistor region (including the source regions, the drain regions, and the channel regions). Using this registration mask and parts (protrusions) of the gate electrodes 37 to 41 as the ion implantation mask, the first ion implantation of p-type impurity, for example, boron is carried out to areas that become the element separation region 35 to form the p-type semiconductor region 61 of relatively high density. The p-type semiconductor region 61 is not introduced under the protrusions 62 of the gate electrodes 37 to 41. For the first ion implantation, the dose amount is set at $1\times10^{14}$ cm$^{-2}$ or below. Preferably, it is set at $1\times10^{13}$ cm$^{-2}$ or above, for example, at about $1\times10^{13}$ cm$^{-2}$.

Then, a registration mask is formed in the region other than the n-type charge accumulation region 53, and through this registration mask, the second ion implantation of p-type impurity, for example, boron is carried out to form the p-type accumulation layer 54 on the surface of the n-type charge accumulation region 53. For the second ion implantation, the dose amount is set at $1\times10^{14}$ cm$^{-2}$ or below, for example, at about $1\times10^{13}$ cm$^{-2}$. The photodiodes 32 and 33 are including the p-type accumulation layer 54 and the n-type charge accumulation region 53.

In the manufacturing method of a MOS-type image sensor according to the fourth embodiment of the invention also, as described in the third embodiment, the gate insulating film 56 of the pixel transistors and the insulating film 57 on the element separation region 35 and the photodiodes 32, 33 are formed in substantially the same thickness by the same heat oxidation process. Thereby, when forming the gate electrodes 37 to 41 for example by means of a polysilicon film, the length d1 of each protrusion 62 extending toward the element separation region 35 can have a relatively short length, and yet, the photodiodes 32, 33 can be formed in good quality. Therefore, the n-type charge accumulation regions 53 of the photodiodes 32, 33 can be formed closer to the pixel transistor formation region.

With the above-described processes, the photodiodes 32, 33 can be formed with the area ratio thereof per unit pixel area raised. Accordingly, even if pixels are miniaturized, it is possible to manufacture a MOS-type image sensor enhanced in the characteristics, such as the saturation charge amount, the sensitivity, and the like.

Description is now made with respect to a manufacturing method of a MOS-type image sensor according to the fifth embodiment of the invention. Although not illustrated, the method includes a step of forming the n-type charge accumulation region 53 constituting the photodiodes 32, 33 to be extended to the region under the element separation region 35. Thereafter, the processes in the above-described first through fourth embodiments are carried out, and thereby the MOS-type image sensor is manufactured.

According to the manufacturing method according to the fifth embodiment of the invention, because the n-type charge accumulation regions 53 of the photodiodes 32, 33 are formed to be extended to the region under the element separation region 35, it is possible to manufacture a MOS-type image sensor in which the areas of the photodiodes 32, 33 has been further expanded.

Here, although the gate insulating film 56 and the insulating film 57 are formed by thermal oxidation, because the oxidation rate is different depending on the conductivity type of the underground semiconductor region, that is, depending on whether it is the p-type or n-type, the thickness of the thermal oxidation film becomes different in a strict sense. The thickness of a gate insulating film is generally about 60 angstrom, however, difference of about from 1 angstrom to 5 angstrom occurs. The thermal oxidation film is generally formed thicker in the n-type region than in the p-type region. However, the film thickness difference in this degree can be negligible and does not have any influence on formation of gate electrodes. Accordingly, the thermal oxidation film continuously formed on the transistor region, the element separation region, and the photodiodes in the same thermal oxidation process can be regarded practically as a flat surface.

In the above-described embodiments, the description has been made taking as an example a MOS-type image sensor, in which pixel transistors are shared by two pixels, however, the invention can be applied to a MOS-type image sensor in which pixel transistors are shared by plural pixels other than two, or to a MOS-type image sensor in which a unit pixel includes one photodiode and a plurality of pixel transistors.

In the above-described embodiments, a case has been taken as an example that an n-channel MOS transistor is used for each pixel transistor, however, the invention is not limited to this, and a p-channel MOS transistor can be also used for each pixel transistor. The element separation region is formed of a semiconductor region of a conductivity type opposite to that of the source region and the drain region of the pixel transistor. In the above examples, the n-type is made the first conductivity-type and the p-type is made the second conductivity-type. However, in the case of the opposite conductivity type, the p-type is made the first conductivity-type and the n-type is made the second conductivity-type.

In the above-described embodiments, the description has be made taking an example case that the invention is applied to an area sensor in which pixels are two-dimensionally arranged with regularity, however, the invention is not limited to such an area sensor and can be applied also to a line sensor in which a plurality of pixels are arranged on a straight line in one-dimensional alignment.

The invention can be applied to either a front-surface incident type MOS image sensor or a rear-surface incident type MOS image sensor.

The solid-state imaging device, more concretely, the MOS-type image sensor, according to an embodiment of the invention is suitably used as the one mounted in mobile apparatuses, such as a mobile-phone with a camera, a PAD, and the like.

In particular, when the pixel size has been miniaturized as the number of pixels is increased, the invention provides improvement in the area ratio of photodiodes per a unit pixel while suppressing occurrence of dark current and white spots, which is extremely useful.

It should be understood by those skilled in the art that various modifications, combinations, subcombinations and alterations may occur depending on design requirements and other factors insofar as they are within the scope of the appended claims or the equivalents thereof.

What is claimed is:

1. An electric apparatus comprising:
   a solid-state imaging device including:
   a gate electrode of a first transfer transistor between a floating diffusion unit and a first photodiode in a layout of a pixel array;
   a gate electrode of a second transfer transistor between the floating diffusion unit and a second photodiode in the layout of the pixel array;
   a gate electrode of a selection transistor between a first semiconductor region and a second semiconductor region in the layout of the pixel array;
   a gate electrode of an amplification transistor between the second semiconductor region and a third semiconductor region in the layout of the pixel array; and
   an element separation region between the first photodiode and the gate electrode of the amplification transistor in the layout of the pixel array,
   wherein the gate electrode of the amplification transistor extends over a part of the element separation region,
   a signal processing circuit coupled to the solid-state imaging device.

2. The electric apparatus according to claim 1, wherein the first semiconductor region and the second semiconductor region are of a first conductivity-type, the element separation region is of a second conductivity-type.

3. The electric apparatus according to claim 2, wherein the first conductivity-type is N-type and the second conductivity-type is P-type.

4. The electric apparatus according to claim 2, wherein the floating diffusion unit is of the first conductivity-type.

5. The electric apparatus according to claim 2, wherein the first conductivity-type is opposite to the second conductivity-type.

6. The electric apparatus according to claim 1, wherein the first transfer transistor is controllable to provide an electrical connection and disconnection between the floating diffusion unit and the first photodiode.

7. The electric apparatus according to claim 1, wherein the second transfer transistor is controllable to provide an electrical connection and disconnection between the floating diffusion unit and the second photodiode.

8. The electric apparatus according to claim 1, wherein the gate electrode of the amplification transistor is electrically connected to the floating diffusion unit.

9. The electric apparatus according to claim 1, further comprising:
   a first line electrically connected to the gate electrode of the first transfer transistor.

10. The electric apparatus according to claim 9, further comprising:
    a second line electrically connected to the gate electrode of the second transfer transistor.

11. The electric apparatus according to claim 1, further comprising:
    a gate electrode of a reset transistor between the third semiconductor region and a fourth semiconductor region in the layout of the pixel array.

12. The electric apparatus according to claim 11, wherein the first semiconductor region and the third semiconductor region are of a same conductivity-type, the second semiconductor region and the fourth semiconductor region are of the same conductivity-type.

13. The electric apparatus according to claim 11, wherein the fourth semiconductor region is electrically connected to the floating diffusion unit.

* * * * *